(12) United States Patent
Saito et al.

(10) Patent No.: US 7,652,315 B2
(45) Date of Patent: Jan. 26, 2010

(54) SPIN TRANSISTOR, PROGRAMMABLE LOGIC CIRCUIT, AND MAGNETIC MEMORY

(75) Inventors: Yoshiaki Saito, Kanagawa (JP); Hideyuki Sugiyama, Kanagawa (JP)

(73) Assignee: Kabuhsiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/169,423

(22) Filed: Jul. 8, 2008

(65) Prior Publication Data

US 2008/0283888 A1   Nov. 20, 2008

Related U.S. Application Data

(63) Continuation of application No. 11/149,267, filed on Jun. 10, 2005, now Pat. No. 7,411,235.

(30) Foreign Application Priority Data

Jun. 16, 2004  (JP) ............................. 2004-178130

(51) Int. Cl.
*H01L 31/113* (2006.01)
(52) U.S. Cl. .............................. 257/295; 257/E29.323; 438/624
(58) Field of Classification Search ................ 257/295, 257/E29.323; 438/624
See application file for complete search history.

(56) References Cited

U.S. PATENT DOCUMENTS

| 5,654,566 | A  | 8/1997  | Johnson |
| 6,108,177 | A  | 8/2000  | Gill |
| 6,297,987 | B1 | 10/2001 | Johnson et al. |
| 6,963,091 | B1 * | 11/2005 | Vashchenko et al. ........ 257/213 |
| 7,274,080 | B1 | 9/2007  | Parkin |
| 2002/0034094 | A1 | 3/2002 | Saito et al. |
| 2003/0020471 | A1 | 1/2003 | Kohlstedt |
| 2004/0178460 | A1 | 9/2004 | Lee et al. |

(Continued)

FOREIGN PATENT DOCUMENTS

JP   11-238924   8/1999

(Continued)

OTHER PUBLICATIONS

Satoshi Sugahara, et al., "A spin metal-oxide-semiconductor field-effect transistor using half-metallic-ferromagnet contacts for the source and drain", Applied Physics Letters, vol. 84, No. 13, Mar. 29, 2004, pp. 2307-2309.

(Continued)

*Primary Examiner*—Zandra Smith
*Assistant Examiner*—Paul E Patton
(74) *Attorney, Agent, or Firm*—Oblon, Spivak, McClelland, Maier & Neustadt, L.L.P.

(57) ABSTRACT

A spin transistor includes a non-magnetic semiconductor substrate having a channel region, a first area, and a second area. The channel region is between the first and the second areas. The spin transistor also includes a first conductive layer located above the first area and made of a ferromagnetic material magnetized in a first direction; and a second conductive layer located above the second area and made of a ferromagnetic material magnetized in one of the first direction and a second direction that is antiparallel with respect to the first direction. The channel region introduces electron spin between the conductive layers. The spin transistor also includes a gate electrode located between the conductive layers and above the channel region; and a tunnel barrier film located between the non-magnetic semiconductor substrate and at least one of the conductive layers.

7 Claims, 29 Drawing Sheets

U.S. PATENT DOCUMENTS

2006/0118839 A1     6/2006     Sugahara et al.

FOREIGN PATENT DOCUMENTS

JP            2003-92412        3/2003
WO     WO 2004/012272 A1     2/2004

OTHER PUBLICATIONS

Mark Johnson, et al., "Spin-injection experiment", Physical Review B, vol. 37, No. 10, Apr. 1, 1988, 12 Pages.

Supriyo Datta, et al. "Electronic analog of the electro-optic modulator", Applied Physics Letters, Vol. 56, No. 7, Feb. 12, 1990, pp. 665-667.

D.J. Monsma, et al., "Perpendicular Hot Electron Spin-Valve Effect in a New Magnetic Field Sensor: The Spin-Valve Transistor", Physical Review Letters, vol. 74, No. 26, 1995, 5 Pages.

K. Mizushima, et al., "Strong increase of the effective polarization of the tunnel current in $Fe/AlO_x/Al$ junctions with decreasing Fe layer thickness", Physical Review B, vol. 58, No. 8, Aug. 15, 1998, pp. 4660-4665.

Keiji Ono, et al., "Enhanced Magnetic Valve Effect and Magneto-Coulomb Oscillations in Ferromagnetic Single Electron Transistor", Journal of the Physical Society of Japan, Vol. 66, No. 5, May 1997, pp. 1261-1264.

N. Akiba, et al., "Magnetotunneling spectroscopy of resonant tunneling diode using ferromagnetic (Ga, Mn) As", Physica B 256-258, 1998, pp. 561-564.

* cited by examiner

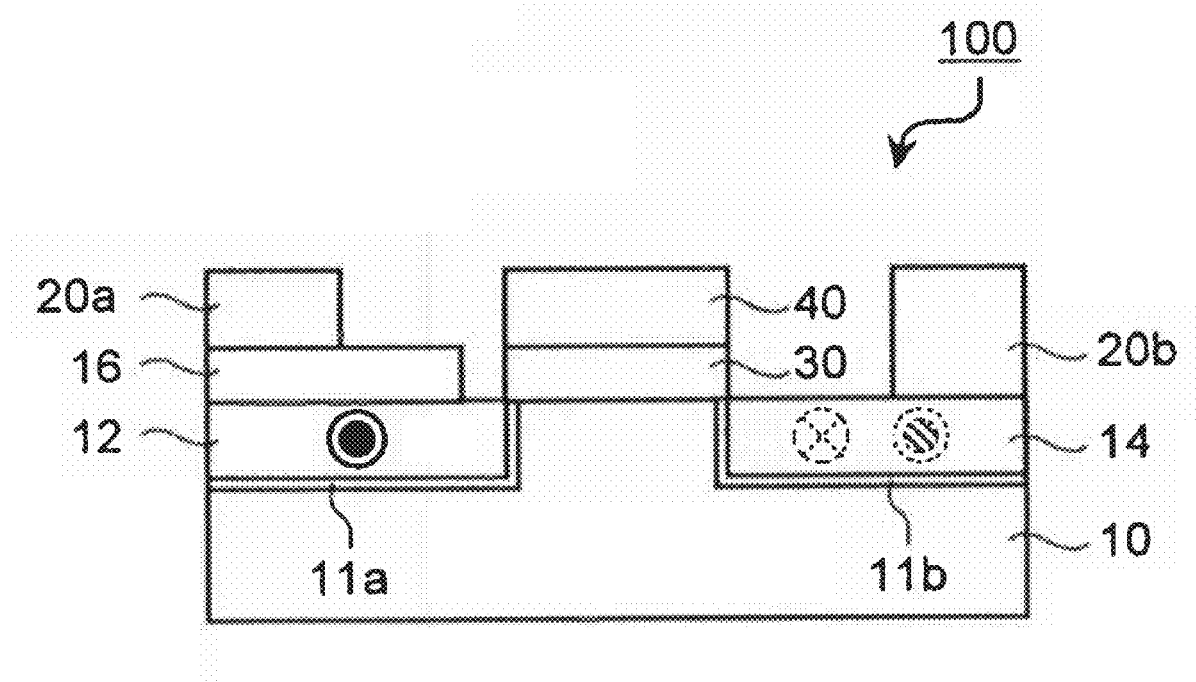

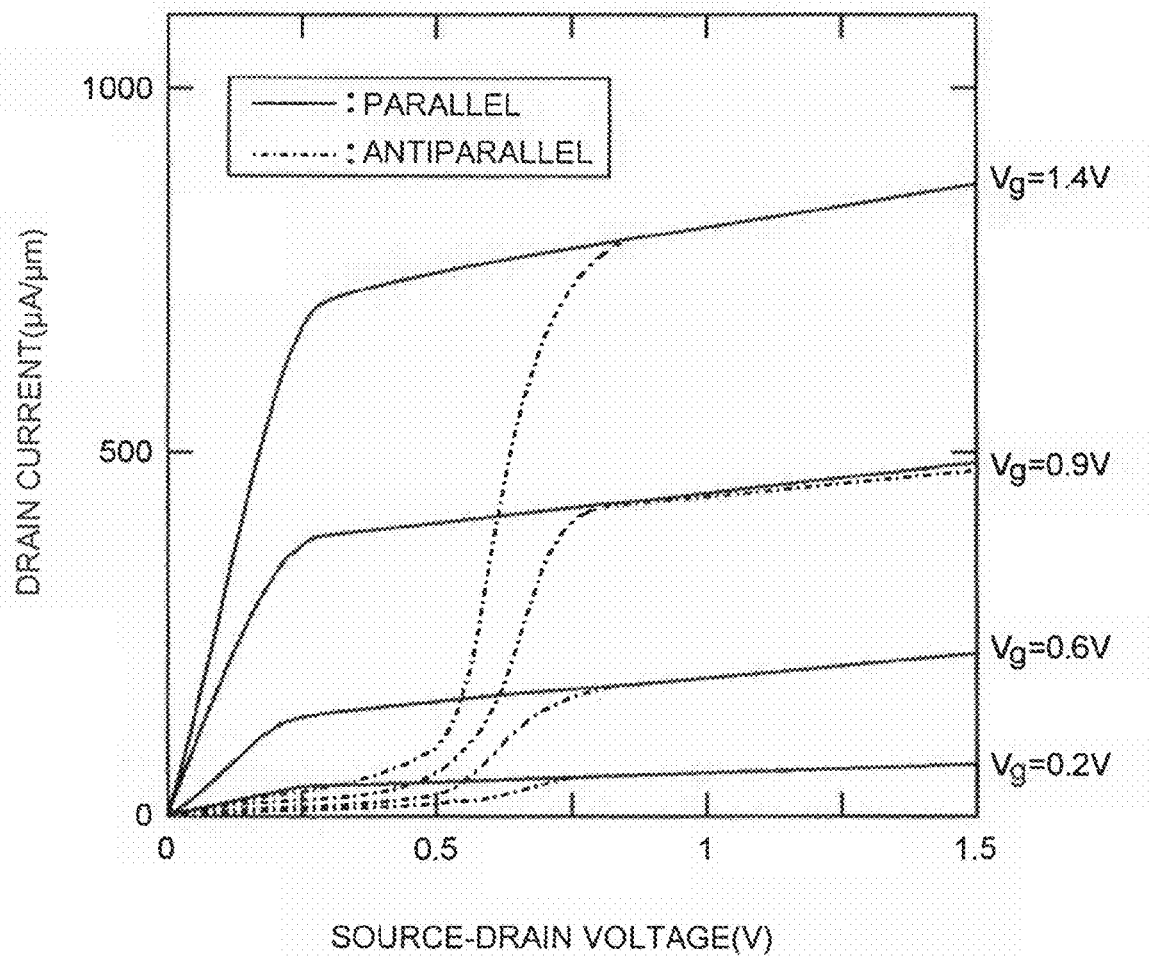

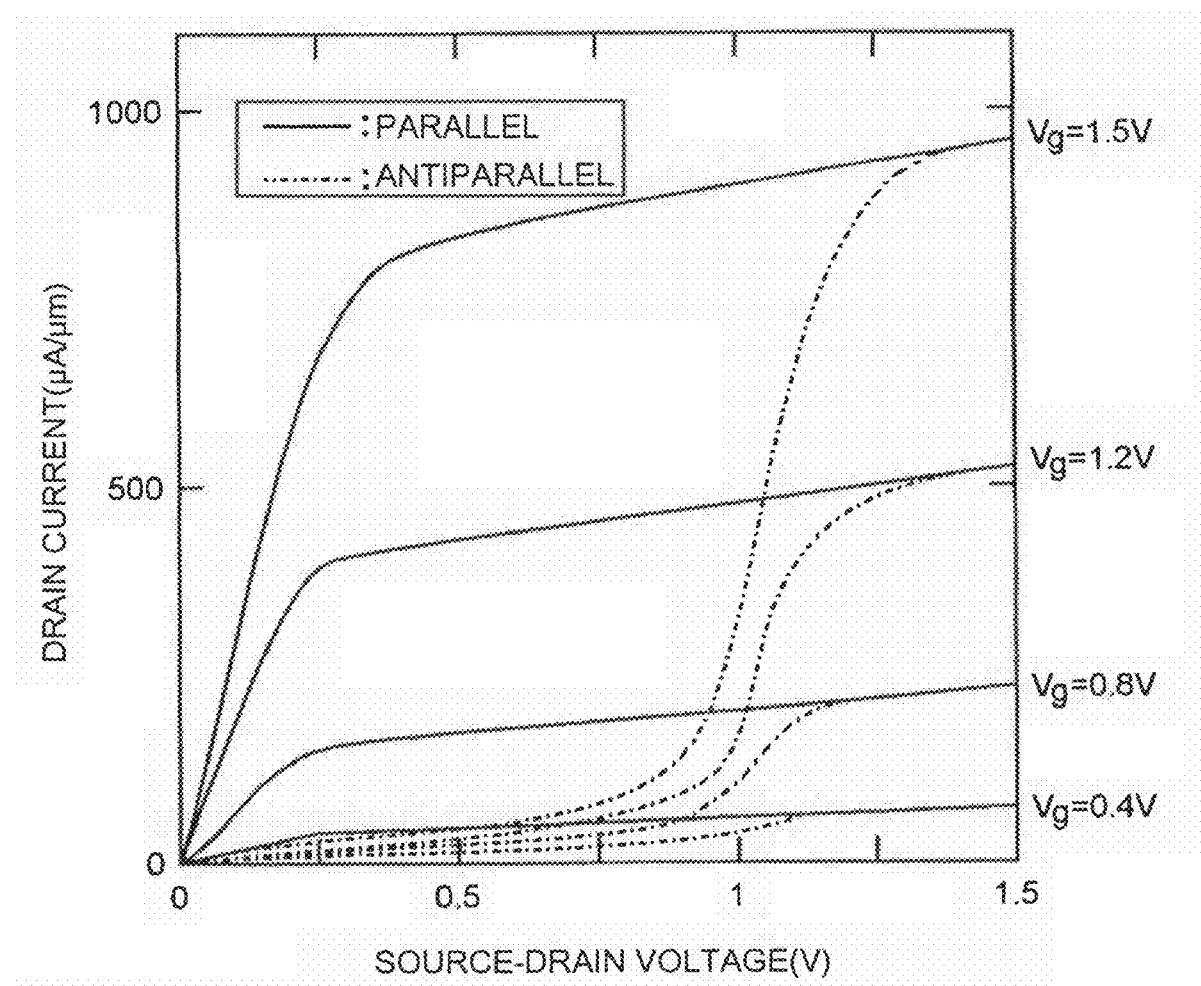

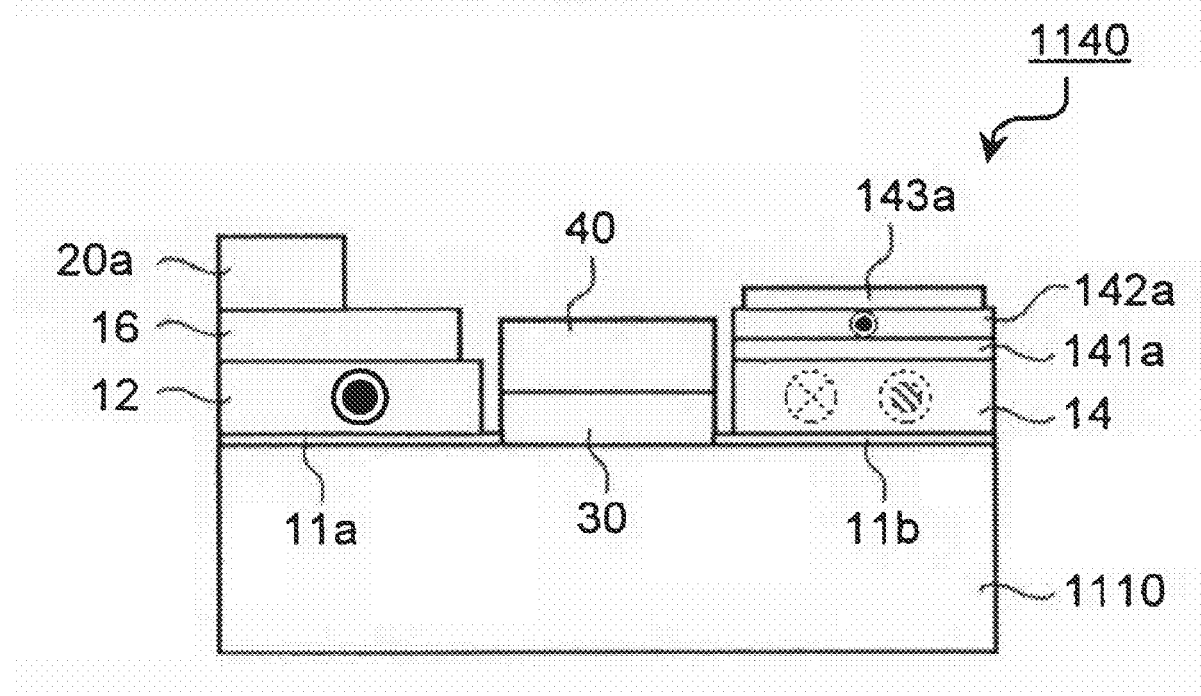

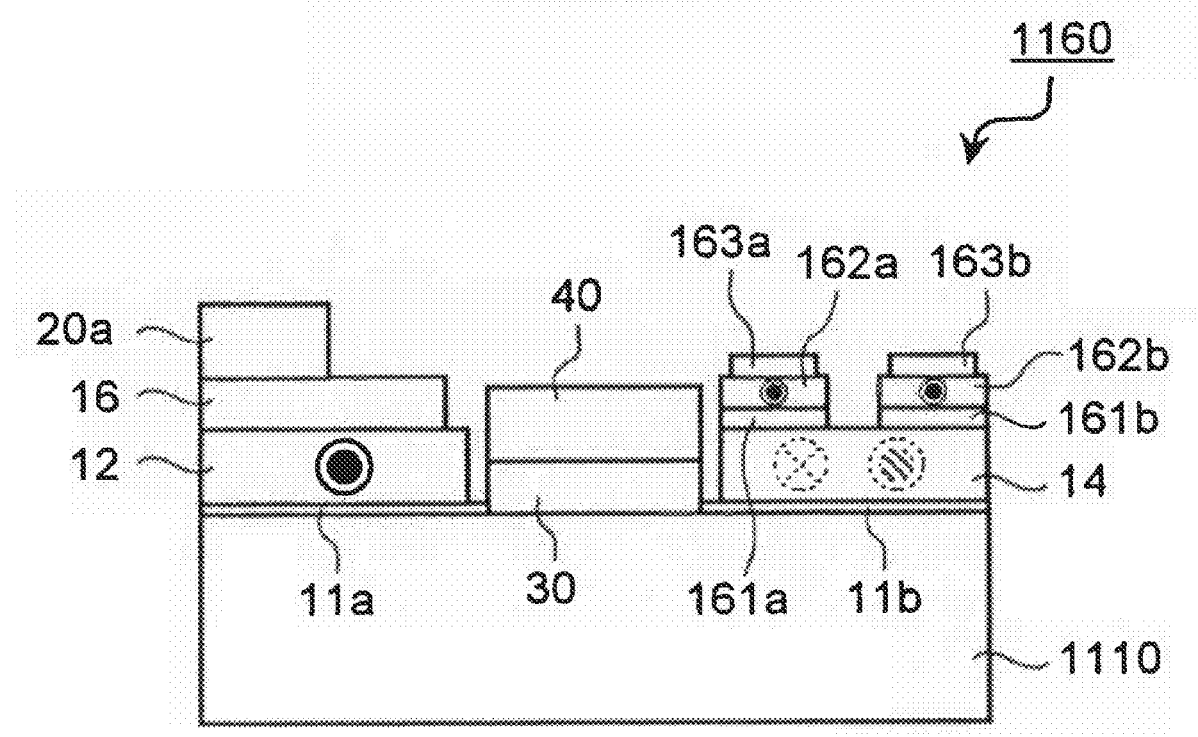

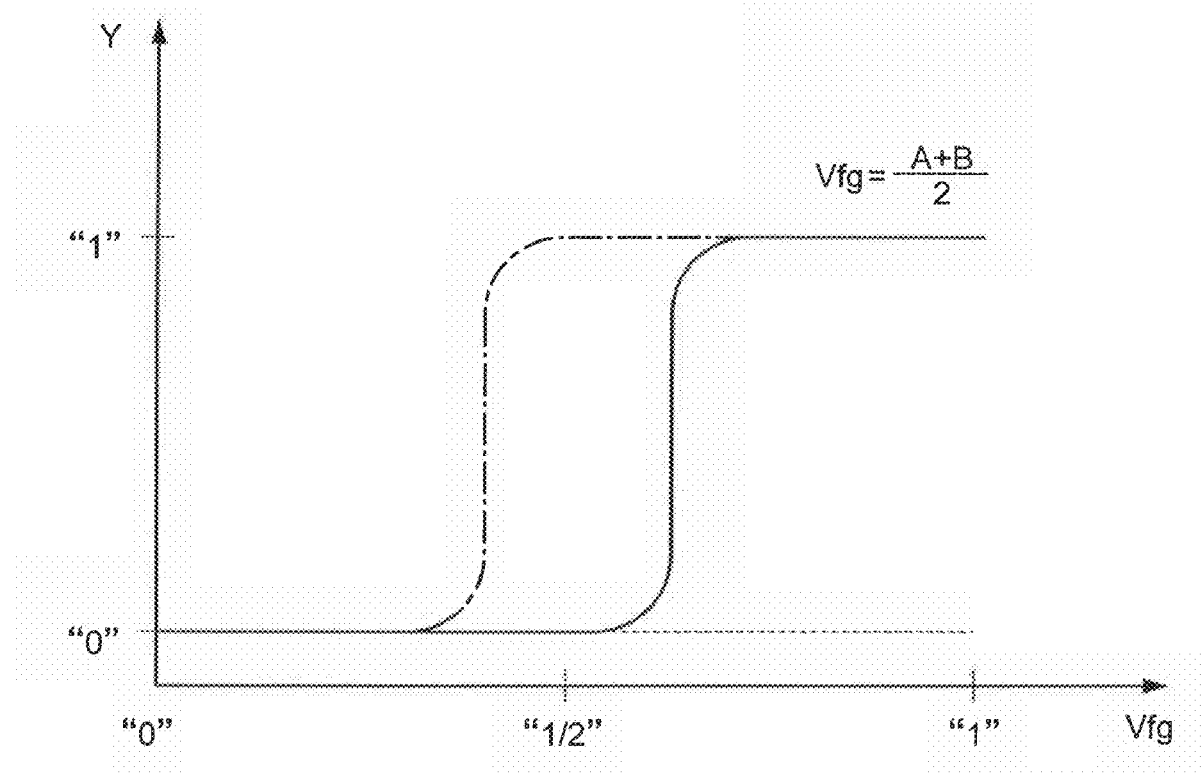

FIG.24A

| A | B | Vfg | MT1 | MT2 | SPIN | | Y |
|---|---|-----|-----|-----|------|---|---|
|   |   |     |     |     | MT1  | MT2 |   |
| 0 | 0 | 0   | off | on  | PARALLEL | PARALLEL | 0 |
| 1 | 0 | 1/2 | on  | on  | PARALLEL | PARALLEL | 0 |
| 0 | 1 | 1/2 | on  | on  | PARALLEL | PARALLEL | 0 |
| 1 | 1 | 1   | on  | off | PARALLEL | PARALLEL | 1 |

FIG.24B

| A | B | Vfg | MT1 | MT2 | SPIN | | Y |
|---|---|-----|-----|-----|------|---|---|
|   |   |     |     |     | MT1  | MT2 |   |
| 0 | 0 | 0   | off | —   | PARALLEL | ANTIPARALLEL | 0 |
| 1 | 0 | 1/2 | on  | —   | PARALLEL | ANTIPARALLEL | 1 |
| 0 | 1 | 1/2 | on  | —   | PARALLEL | ANTIPARALLEL | 1 |
| 1 | 1 | 1   | on  | —   | PARALLEL | ANTIPARALLEL | 1 |

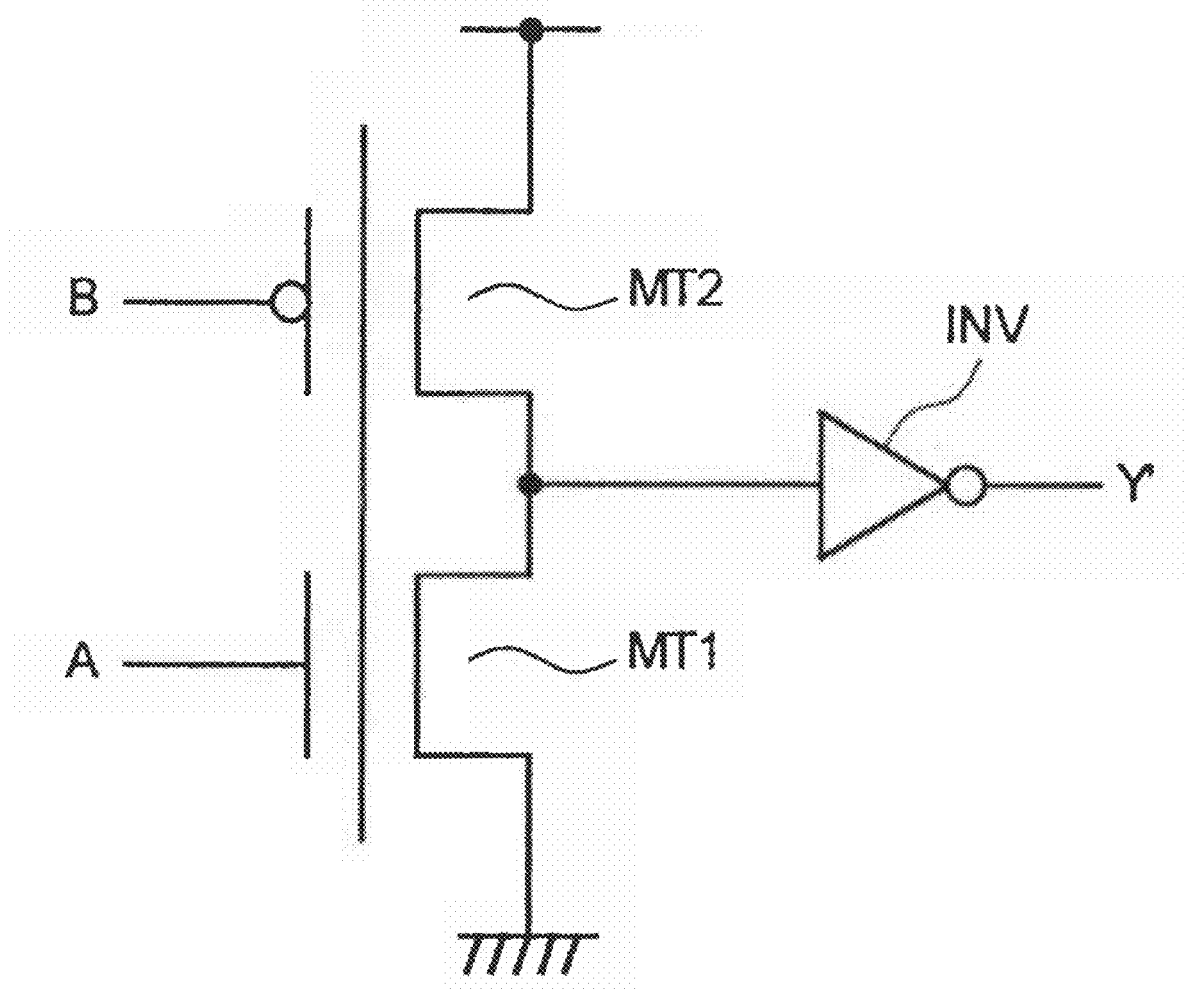

FIG.26A

| B | A | Vfg | MT2 | MT1 | SPIN | | Y' |
|---|---|---|---|---|---|---|---|
| | | | | | MT2 | MT1 | |
| 0 | 0 | 0 | on | — | PARALLEL | ANTIPARALLEL | 0 |
| 1 | 0 | 1/2 | on | — | PARALLEL | ANTIPARALLEL | 0 |
| 0 | 1 | 1/2 | on | — | PARALLEL | ANTIPARALLEL | 0 |
| 1 | 1 | 1 | off | — | PARALLEL | ANTIPARALLEL | 1 |

FIG.26B

| B | A | Vfg | MT2 | MT1 | SPIN | | Y' |
|---|---|---|---|---|---|---|---|
| | | | | | MT2 | MT1 | |
| 0 | 0 | 0 | on | off | PARALLEL | PARALLEL | 0 |
| 1 | 0 | 1/2 | on | on | PARALLEL | PARALLEL | 1 |
| 0 | 1 | 1/2 | on | on | PARALLEL | PARALLEL | 1 |
| 1 | 1 | 1 | off | on | PARALLEL | PARALLEL | 1 |

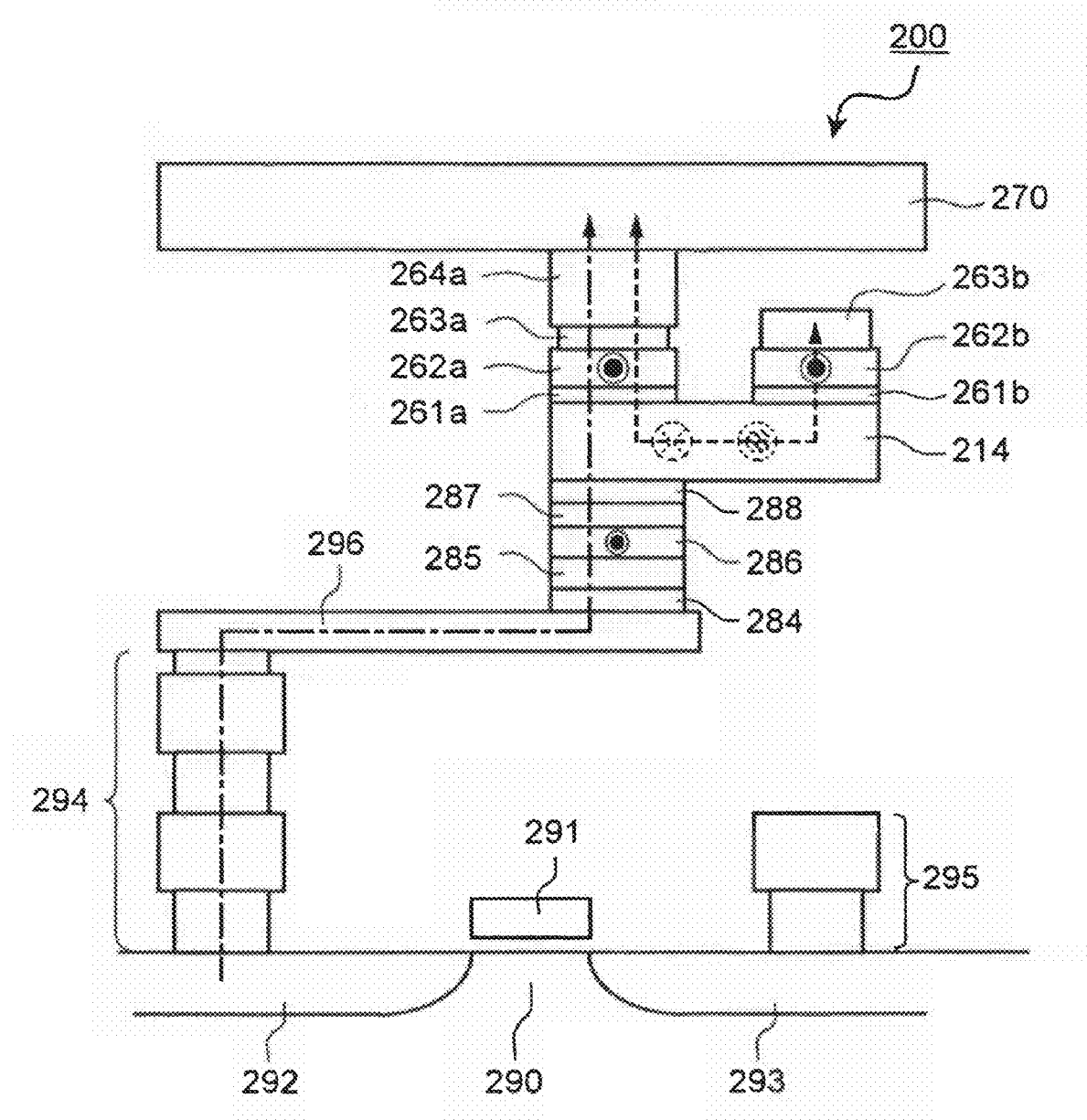

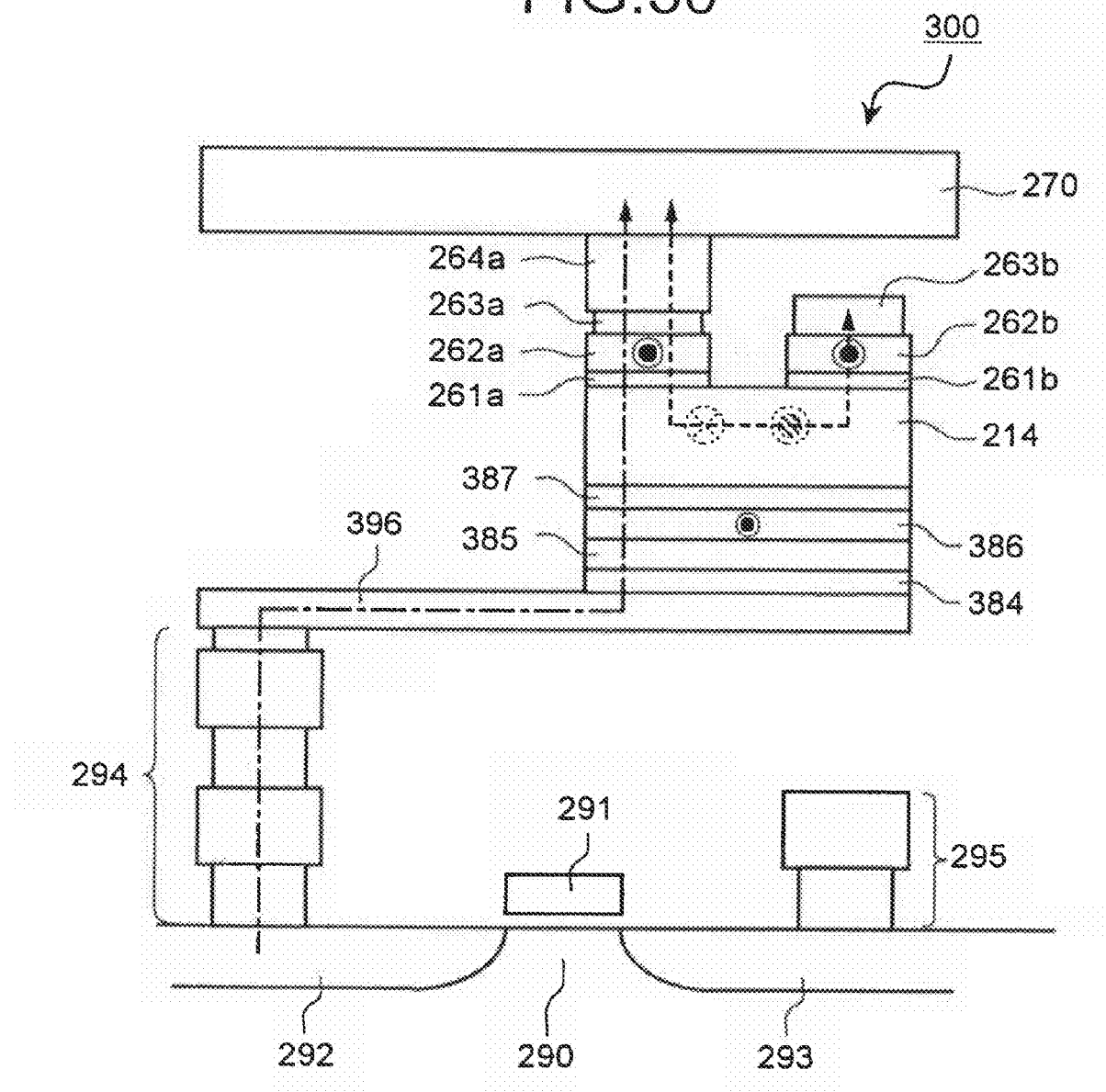

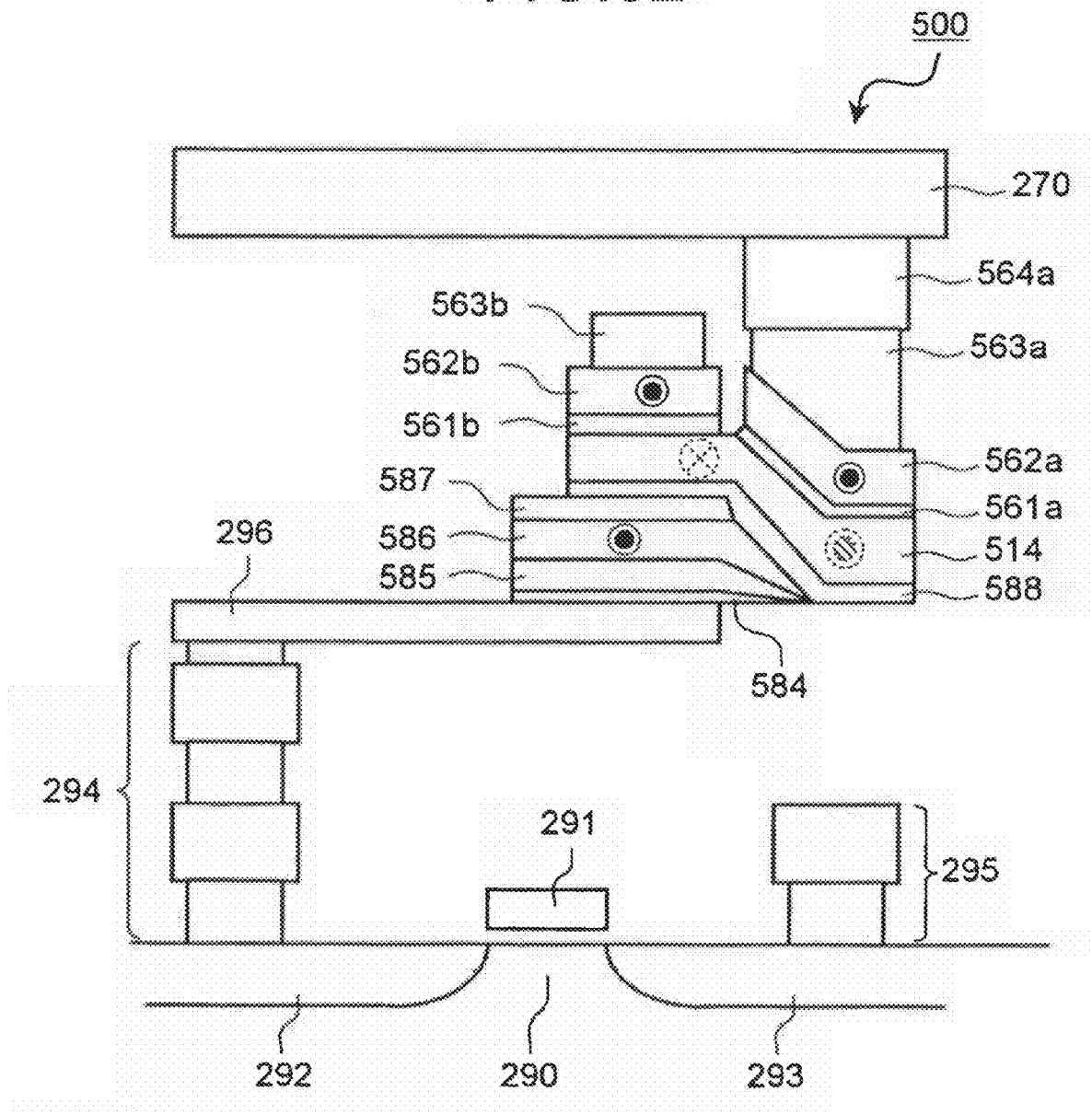

SPIN TRANSISTOR, PROGRAMMABLE LOGIC CIRCUIT, AND MAGNETIC MEMORY

CROSS-REFERENCE TO RELATED APPLICATIONS

This application is a continuation of U.S. application Ser. No. 11/149,267, filed on Jun. 10, 2005, which claims the benefit of priority from the prior Japanese Patent Application No. 2004-178130, filed on Jun. 16, 2004; the entire contents of which are incorporated herein by reference.

BACKGROUND OF THE INVENTION

1. Field of the Invention

The present invention relates to a spin transistor with a MOS structure that utilizes a tunnel magnetoresistive effect, and, more particularly, to a spin transistor that has an amplifying effect and a magnetic memory that can control the recording state through spin injection in the plane direction.

2. Description of the Related Art

In recent years, spin electronics devices that utilize the spin freedom of electrons have been widely developed and studied. Also, more and more studies are being made on application of the tunnel magnetoresistive effect (TMR) to magnetic random access memories (MRAM), magnetic reproducing heads, or the likes. Particularly, attention is being drawn to spin transistors that have semiconductors and magnetic bodies combined.

Typical examples of such spin transistors include a diffusion-type spin transistor (Mark Johnson type; disclosed in M. Johnson et al., Phys. Rev. B37, 5326, (1988)), a Supriyo-Datta spin transistor (spin orbit control type; disclosed in D. Datta et al., Appl. Phys. Lett. 56, 665 (1990)), a spin valve transistor (disclosed in D. J. Monsma et al., Phys. Rev. Lett. 74, 5260 (1995) and K. Mizushima et al., Phys. Rev. B58, 4660 (1998)), a single-electron spin transistor (disclosed in K. Ono et al., J. Phys. Soc. Jpn 66, 1261 (1997)), and a resonant spin transistor (disclosed in N. Akiba et al., Physica B256-258, 561 (1998)).

Also, a spin transistor with a MOS structure that has the source and drain made of magnetic materials, and has a point contact between the channel and the drain, has been developed (disclosed in Japanese Patent Application Laid-Open No. 2003-92412). This point contact is of such a size as to cause a quantum effect for spin-polarized electrons, and has much higher resistance than the channel resistance. The interface resistance between the channel and the drain is the principal factor to determine the magnetization dependency of the drain current. Therefore, with this spin transistor, a higher magneto-resistance ratio (MR ratio) can be obtained.

Also, a programmable logic circuit in which a MRAM and a MOSFET are combined to form basic logic gates such as an AND gate and an OR gate has been developed. In such a programmable logic circuit, the memory state of the MRAM is changed to switch on and off those logic gates.

However, any of the above described spin transistors does not have an amplifying function, and only maintains the switching function among the transistor functions.

The spin transistor disclosed in JP-A No. 2003-92412 has the problem of a decrease in device response speed due to an increase in the resistance of the point contact. Among the reports on experiments carried out on spin transistors having point contacts, there are cases where a high MR ratio was obtained, as well as cases where a high MR ratio was not obtained. It is difficult to apply such spin transistors to a logic circuit that include a number of devices.

In the case of a spin transistor not having a point contact, a high MR ratio can be achieved by employing an intrinsic semiconductor as the semiconductor substrate and magnetic semiconductors as magnetic bodies to be the source and drain. More specifically, a Schottky barrier is formed at the interface between the channel and the source and drain, and spin injection is performed via the Schottky barrier. The magnetic semiconductor can be obtained by replacing part of the atoms of a semiconductor body with a magnetic material such as Mn. However, a magnetic semiconductor cannot presently exhibit a preferable angle ratio at room temperature, and so far has only a limited operability at a low temperature.

Further, when a programmable logic circuit is formed by combining a MRAM and a MOSFET, the wiring structure between a MRAM that is formed with a magnetic layer and a MOSFET that is formed with a semiconductor layer becomes complicated.

SUMMARY OF THE INVENTION

According to an aspect of the present invention, a spin transistor includes a non-magnetic semiconductor substrate having a channel region, a first area, and a second area, the channel region being between the first area and the second area; a first conductive layer located above the first area and made of a ferromagnetic material magnetized in a first direction; a second conductive layer located above the second area and made of a ferromagnetic material magnetized in one of the first direction and a second direction that is antiparallel with respect to the first direction, the channel region introducing electron spin between the first conductive layer and the second conductive layer; a gate electrode located between the first conductive layer and the second conductive layer and above the channel region; and a tunnel barrier film located between the non-magnetic semiconductor substrate and at least one of the first conductive layer and the second conductive layer.

BRIEF DESCRIPTION OF THE DRAWINGS

FIG. 1 is a schematic cross-sectional view of a spin transistor according to a first embodiment of the present invention;

FIG. 9 is a graph showing the drain current characteristics of a spin transistor according to the third embodiment;

FIG. 10 is a graph showing the drain current characteristics of another example of a spin transistor according to the third embodiment;

FIG. 14 is a schematic cross-sectional view of still another example of a spin transistor according to the fourth embodiment;

FIG. 19 is a schematic cross-sectional view of another example of a spin transistor according to the sixth embodiment;

FIG. 23 is a graph showing the output characteristics of the programmable logic circuit illustrated in FIG. 20;

FIG. 24A is a truth table in the case where the programmable logic circuit of FIG. 21 is in a "parallel" state;

FIG. 24B is a truth table in the case where the programmable logic circuit of FIG. 21 is in an "antiparallel state;

FIG. 25 illustrates another example of a programmable logic circuit that is formed with the spin transistor illustrated in FIG. 20;

FIG. 26A is a truth table in the case where the programmable logic circuit of FIG. 25 is in a "antiparallel" state;

FIG. 26B is a truth table in the case where the programmable logic circuit of FIG. 25 is in an "parallel" state;

FIG. 28 is a schematic cross-sectional view of a magnetic memory according to a ninth embodiment of the present invention;

FIG. 30 illustrates a modification of the magnetic memory of FIG. 28;

FIG. 32 illustrates another modification of the magnetic memory of FIG. 28.

DETAILED DESCRIPTION OF THE PREFERRED EMBODIMENTS

Figure 2A:
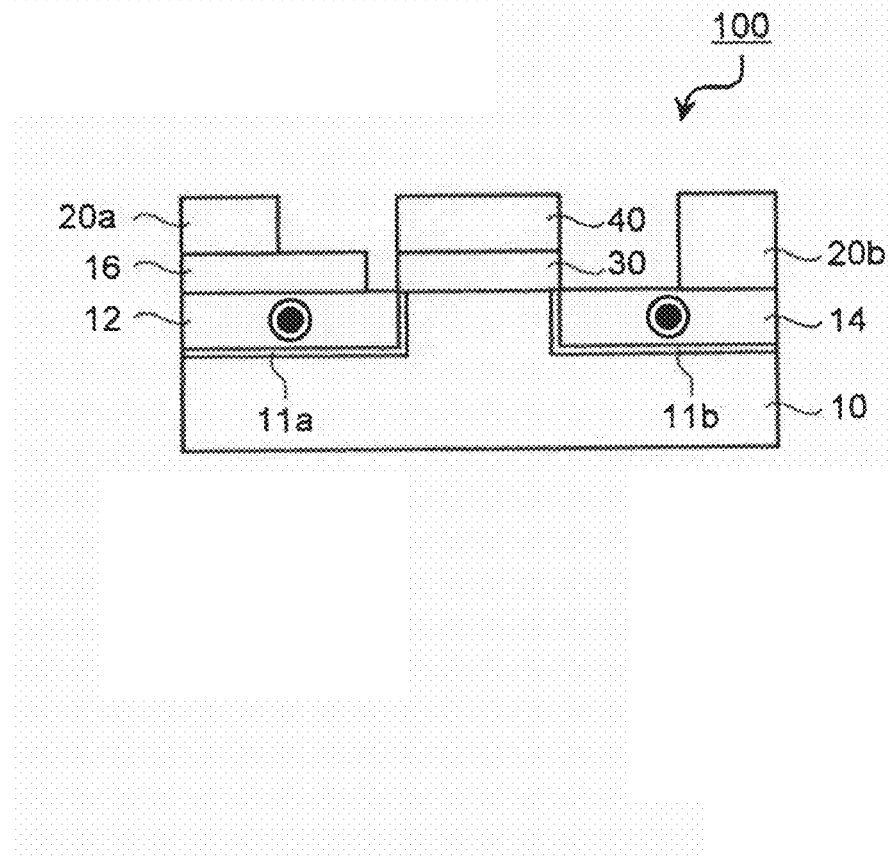
FIG. 2A is a schematic cross-sectional view of the spin transistor in the case where the magnetizing direction of the second conductive layer is in a "parallel" state.

The following is a description of embodiments of spin transistors, magnetic memories, and programmable logic circuits according to the present invention, with reference to the accompanying drawings. It should be noted that the drawings show only schematic views. Therefore, the relationship between the thickness and the width of each component, and the size ratio between components might be not true to the actual size. Also, even if the same structure is shown in two or more drawings, the size and the size ratio might vary.

A spin transistor according to a first embodiment of the present invention is a transistor with a MOS structure that has a source and a drain formed with a magnetic material. Also, such a spin transistor characteristically has a tunnel barrier film found between the channel and the source and/or the drain.

FIG. 1 is a schematic cross-sectional view of a spin transistor of the first embodiment. In FIG. 1, a spin transistor 100 includes a semiconductor substrate 10, a first conductive layer 12 and a second conductive layer 14 that are formed on the semiconductor substrate 10, a tunnel barrier film 11a that is formed between the first conductive layer 12 and the semiconductor substrate 10, a tunnel barrier film 11b that is formed between the second conductive layer 14 and the semiconductor substrate 10, a gate insulating film 30 that is formed on a part of the semiconductor substrate 10 that is located between the first conductive layer 12 and the second conductive layer 14, a gate electrode 40 that is formed on the gate insulating film 30, an antiferromagnetic layer 16 that is formed on the first conductive layer 12, an electrode 20a that is formed on the antiferromagnetic layer 16, and an electrode 20b that is formed on the second conductive layer 14. The first conductive layer 12 is a layer that functions as either the source or the drain of the MOS transistor. The second conductive layer 14 is a layer that functions as the other one of the source and the drain of the MOS transistor. This spin transistor 100 has the same structure as a conventional MOS transistor, except that ferromagnetic bodies are used as the source and the drain, and the tunnel barrier films 11a and 11b are formed. Accordingly, the region of the semiconductor substrate 10 that is located immediately below the gate insulating film 30 and is interposed between the first conductive layer 12 and the second conductive layer 14 functions as a channel.

The semiconductor substrate 10 may be an intrinsic semiconductor that is made of Si or Ge, a compound semiconductor that is made of GaAs or ZnSe, or a highly conductive semiconductor that is formed by subjecting either of an intrinsic semiconductor or a compound semiconductor to doping. The first conductive layer 12 is a ferromagnetic body that functions as a magnetism fixing layer whose magnetism is fixed in a predetermined direction. In other words, most of the electrons contained in the first conductive layer 12 are polarized in a predetermined spin direction. In FIG. 1, the electron spin direction in the first conductive layer 12 is the forward direction with respect to the drawing sheet. The first conductive layer 12, for example, may be formed with a ferromagnetic thin film that is made of at least one material selected from the group of:

i) NiFe alloy, CoFe alloy, or CoFeNi alloy;
ii) (Co, Fe, Ni)—(Si, B) based alloy, or (Co, Fe, Ni)—(Si, B)—(P, Al, Mo, Nb, Mn) based alloy;
iii) amorphous material such as Co—(Zr, Hf, Nb, Ta, Ti) film;
iv) $CO_2(CrxFe_{1-x})Al$ based or $CO_2MnAl$, $CO_2MnSi$ based Heusler's alloy (half metal); and
v) diluted magnetic semiconductor such as SiMn or GeMn.

The first conductive layer 12 may also be formed with a multi-layer film that is made of at least one material selected from the above group.

The first conductive layer 12 should preferably have unidirectional anisotropy. The thickness of the first conductive layer 12 is preferably 0.1 nm to 100 nm, more preferably 0.4 nm or greater, which is the thickness that prevents super paramagnetism.

The antiferromagnetic layer 16 is a thin film that is formed to firmly and stably fix the magnetization of the first conductive layer 12. The antiferromagnetic layer 16 may be made of FeMn, PtMn, PtCrMn, NiMn, IrMn, NiO, or $Fe_2O_3$, for example.

The second conductive layer 14 is a ferromagnetic body that functions as a magnetic recording layer, and has its magnetizing direction varying with a magnetic field or spin injection that is given from the outside. More specifically, the magnetizing direction of the second conductive layer 14 can be controlled to be "parallel" or "antiparallel" with respect to the magnetizing direction of the first conductive layer 12. Here, "being parallel to a magnetizing direction" means that the two magnetizing directions are substantially the same, while "being antiparallel to a magnetizing direction" means that the two magnetizing directions are substantially opposite from each other. In the descriptions that will follow, "being parallel" and "being antiparallel" will be used in this definition. In FIG. 1, the magnetization of the second conductive layer 14 is directed forward or backward with respect to the plane of the paper sheet. Like the first conductive layer 12, the second conductive layer 14 may be formed with a ferromagnetic thin film. Also, the second conductive layer 14 should preferably have a uniaxial anisotropy, and have the same thickness as the first conductive layer 12. As the second conductive layer 14, a double-layer structure consisting of a soft magnetic layer and a ferromagnetic layer, or a three-layer structure consisting of a ferromagnetic layer, a soft magnetic layer, and a ferromagnetic layer, may be employed.

A non-magnetic element such as Ag, Cu, Au, Al, Mg, Si, Bi, Ta, B, C, O, N, Pd, Pt, Zr, Ir, W, Mo, Ru, Re, Os, Nb, or B may be added to the magnetic bodies that form the first conductive layer 12 and the second conductive layer 14, so as to control various properties including magnetic characteristics, crystalline characteristics, mechanical characteristics, and chemical characteristics.

The tunnel barrier films 11a and 11b may be formed with an oxide or nitride of such as Si, Ge, Al, Ga, Mg, Ti, or Ta. The gate insulating film 30 may be formed with the same material as the gate insulating film of a conventional MOS transistor, such as $SiO_2$.

The gate electrode 40, the electrode 20a, and the electrode 20b may be formed with electrode materials that are used in conventional MOS transistors. The gate electrode 40 may be made of polycrystalline silicon, for example. The electrodes 20a and 20b, and the gate extension electrode (not shown), may be made of aluminum or polycrystalline silicon, for example.

Figure 2B:
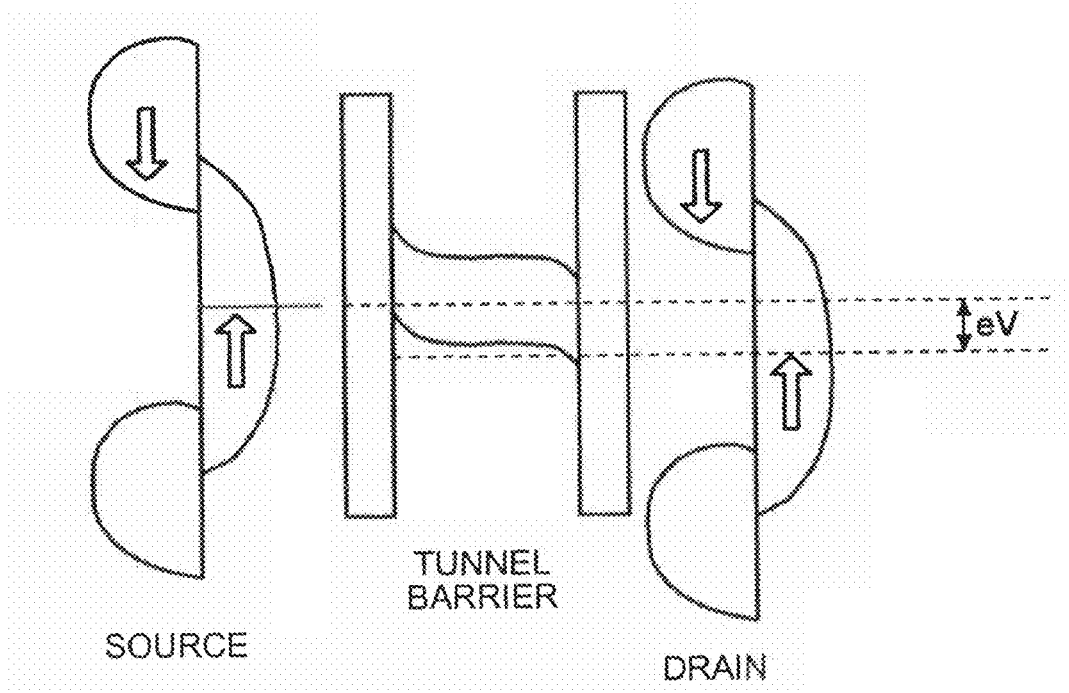
FIG. 2B shows the energy band of the spin transistor in the case where the magnetizing direction of the second conductive layer is in a "parallel" state.

FIG. 2A schematically illustrates the spin transistor 100 when the magnetizing direction of the second conductive layer 14 is "parallel" to the magnetizing direction of the first conductive layer 12. FIG. 2B shows the energy band of the first conductive layer 12, the second conductive layer 14, and the tunnel barrier films 11a and 11b of this case. In the case illustrated in FIG. 2B, the first conductive layer 12 and the second conductive layer 14 are made of half metal such as Heusler's alloy.

Between two regions of the same magnetizing direction, the electron spin that is polarized in the same direction as the magnetizing direction easily flows. Accordingly, when two magnetizing directions are "parallel" to each other, the spin transistor 100 has the same switching function as that of a conventional MOS transistor. Thus, the voltage to be applied to the gate electrode 40 is adjusted to control the conduction between the electrode 20a and the electrode 20b.

More specifically, the voltage applied between the electrode 20a and the electrode 20b excites the electrons of the first conductive layer 12 in the conductive band. The electrons permeate through the energy barrier of the tunnel barrier film 11a, and reach the conductive band of the second conductive layer 14 via the conductive band of the channel region lowered to the gate voltage and the energy barrier of the tunnel barrier film 11b. When the two magnetizing directions are "parallel" to each other, the energy band structure of the first conductive layer 12 is the same as the energy band structure of the second conductive layer 14 in terms of the spin up electrons and spin down electrons, as shown in FIG. 2B. The spin up electrons move to the spin up band, and the spin down electrons move to the spin down band. Accordingly, the excited electrons can readily move from the first conductive layer 12 to the second conductive layer 14.

Figure 3A:
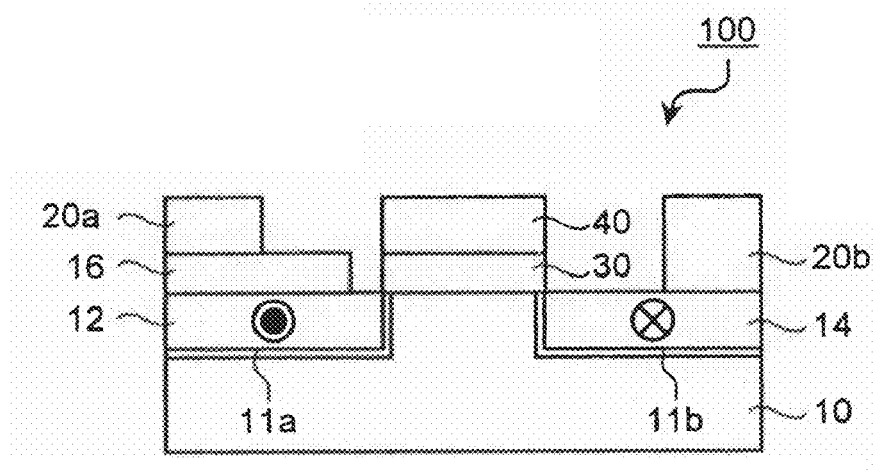
FIG. 3A is a schematic cross-sectional view of the spin transistor in the case where the magnetizing direction of the second conductive layer is in an "antiparallel" state.
Figure 3B:
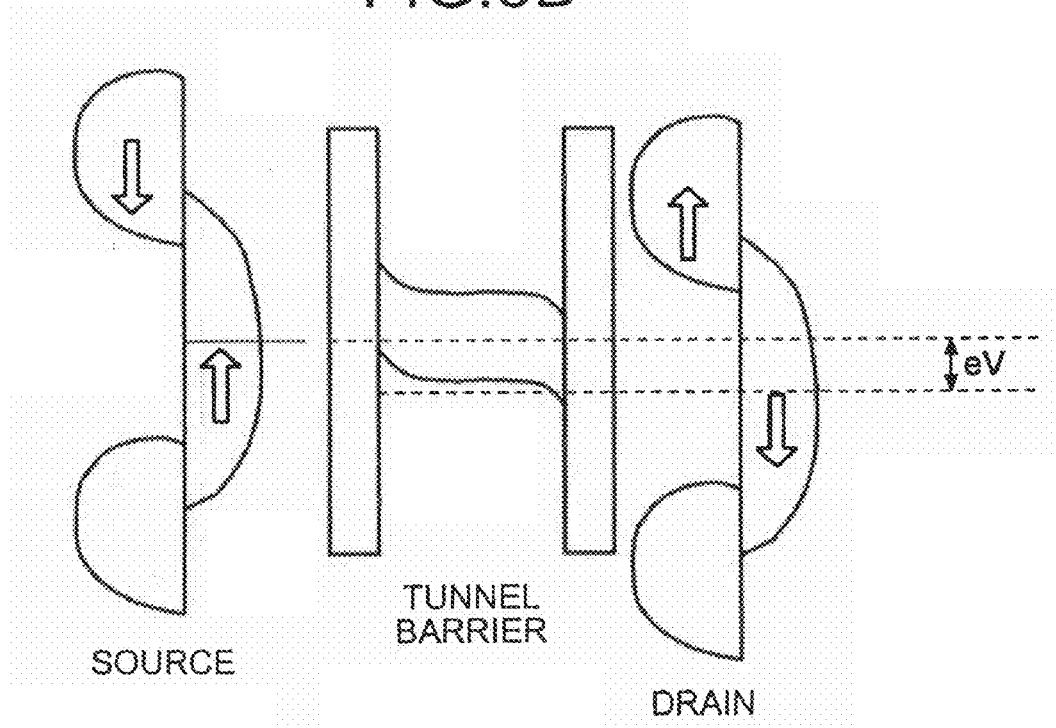
FIG. 3B shows the energy band of the spin transistor in the case where the magnetizing direction of the second conductive layer is in an "antiparallel" state.

FIG. 3A schematically illustrates the spin transistor 100 when the magnetizing direction of the second conductive layer 14 is "antiparallel" to the magnetizing direction of the first conductive layer 12. FIG. 3B shows the energy band of the first conductive layer 12, the second conductive layer 14, and the tunnel barrier films 11a and 11b in this case. In the case illustrated also in FIG. 3B, the first conductive layer 12 and the second conductive layer 14 are made of half metal.

Between two regions of different magnetizing directions, the electron spin that is polarized in a region of the magnetic directions hardly flows in the other one of the magnetic directions. Accordingly, when two magnetic directions are "antiparallel" to each other, the spin transistor 100 is equivalent to a MOS transistor in an OFF state. Even if a voltage higher than the threshold value is applied to the gate electrode 40, current hardly flows between the electrode 20a and the electrode 20b.

When two magnetizing directions are "antiparallel" to each other, the energy band structure of the first conductive layer 12 and the energy band structure of the second conductive layer 14 are not the same in terms of the spin up electrons and the spin down electrons. Therefore, it is difficult for the excited electrons to move from the first conductive layer 12 to the second conductive layer 14.

In the case where a gate voltage higher than the threshold value is applied between the electrode 20a and the electrode 20b, it is possible to determine, by measuring the current flowing between the electrode 20a and the electrode 20b, whether the magnetizing direction of the second conductive layer 14 is "parallel" or "antiparallel" to the magnetizing direction of the first conductive layer 12. This implies that the spin transistor 100 is equipped with a memory function. Particularly, the second conductive layer 14 maintains its magnetizing direction, unless external energy is given through a current magnetic field or spin injection. Accordingly, a nonvolatile memory function is realized.

The spin transistor 100 also has the same amplifying function as that of a conventional MOS transistor. When a gate voltage higher than the threshold value is applied, the band edge of the valence band of the semiconductor located in the channel region is uplifted (while the band edge of the conductive band is lowered accordingly). The electrons injected into the channel through the first conductive layer 12 then easily move to the second conductive layer 14 via the channel. In other words, the permeability of the electrons in the channel region, or the amount of electrons that can permeate through the channel region, depends on the gate voltage. This implies that the current flowing between the first conductive layer 12 and the second conductive layer 14 can be amplified by adjusting the gate voltage.

In a conventional MOS-type spin transistor, an intrinsic semiconductor is employed as a semiconductor substrate to form a Schottky barrier. In the spin transistor 100, however, a tunnel barrier is formed instead of a Schottky barrier. Accordingly, a compound semiconductor or a doped semiconductor can be employed as the semiconductor substrate. This gives the spin transistor 100 high selectivity in terms of the material.

As described above, with the spin transistor 100 of the first embodiment, the first conductive layer 12 and the second conductive layer 14 form a MOS transistor that is formed with a magnetic body or a magnetic semiconductor. Also, the tunnel barrier films 11a and 11b are formed between the first conductive layer 12 and the second conductive layer 14. Accordingly, as well as the switching function and the amplifying function of a conventional MOS transistor, a memory function can also be provided by adjusting the magnetizing direction in the second conductive layer 14.

Even if a tunnel barrier film is formed only between the first conductive layer 12 and the channel or between the second conductive layer 14 and the channel, the above effects can be achieved.

Figure 4:
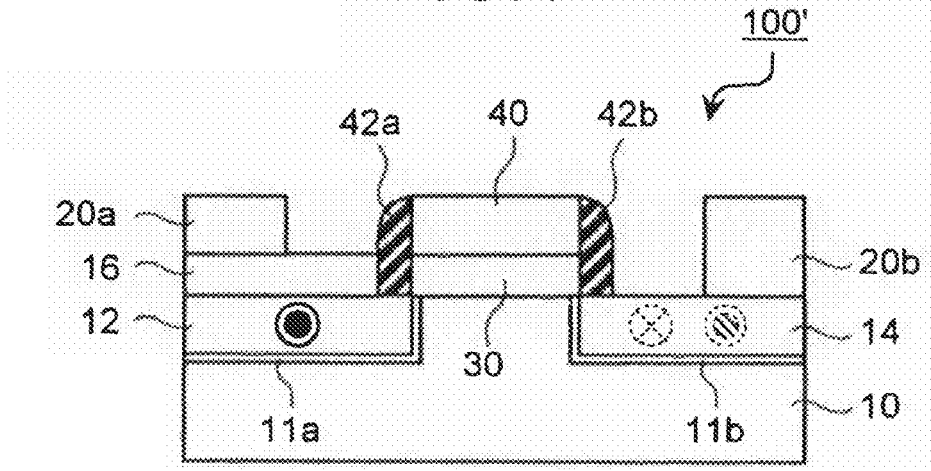
FIG. 4 is a schematic cross-sectional view of another example of the spin transistor according to the first embodiment.

In FIG. 1, there is nothing formed on the side surfaces of the gate insulating film 30 and the gate electrode 40. However, it is also possible to form insulating films 42a and 42b on the surfaces of the gate insulating film 30 and the gate electrode 40, as in a spin transistor 100' shown in FIG. 4. The insulating films 42a and 42b are, for example, formed by performing CVD (Chemical Vapor Deposition) or sputtering, and then performing selective etching such as RIE (Reactive Ion Etching).

Figure 5:
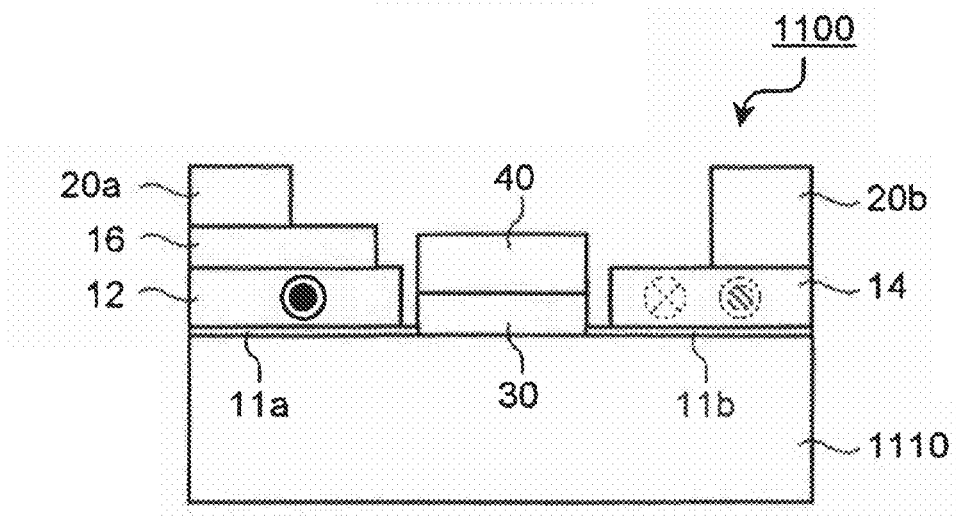
FIG. 5 is a schematic cross-sectional view of yet another example of the spin transistor according to the first embodiment.
Figure 6:
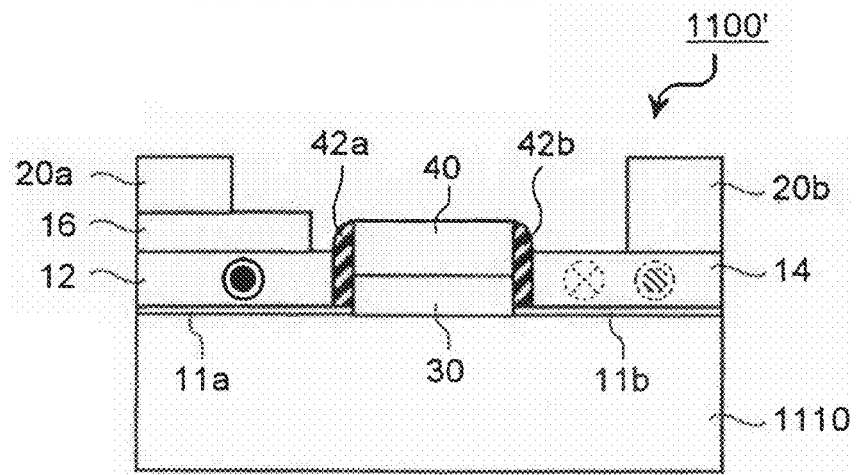
FIG. 6 is a schematic cross-sectional view of still another example of the spin transistor according to the first embodiment.

In the structure illustrated in FIG. 1, the first conductive layer 12 and the second conductive layer 14 are embedded in the semiconductor substrate 10. However, those conductive layers may be formed on the principal surface of the semiconductor substrate, as shown in FIG. 5 (hereinafter, this type of structure will be referred to as a surface laminated MOS structure). In a spin transistor 1100 shown in FIG. 5, the tunnel barrier films 11a and 11b are formed on the surface of the semiconductor substrate 1110. The first conductive layer 12 is formed on the tunnel barrier film 11a, while the second conductive layer 14 is formed on the tunnel barrier film 11b. In FIG. 5, the same components as those of the structure shown in FIG. 1 are denoted by the same reference numerals as those shown in FIG. 1. A channel is formed immediately below the gate insulating film 30. In this manner, even with a spin transistor of the surface laminated MOS structure in which the first conductive layer 12 and the second conductive layer 14 are formed on the principal surface of the semiconductor substrate 1110, the effects of the structure shown in FIG. 1 can be achieved. Further, as in a spin transistor 1100' shown in FIG. 6, it is also possible to form insulating films 42a and 42b between the first conductive layer 12 and side surfaces of the gate insulating film 30 and the gate electrode 40, and between the second conductive layer 14 and side surfaces of the gate insulating film 30 and the gate electrode 40, respectively.

Figure 7:
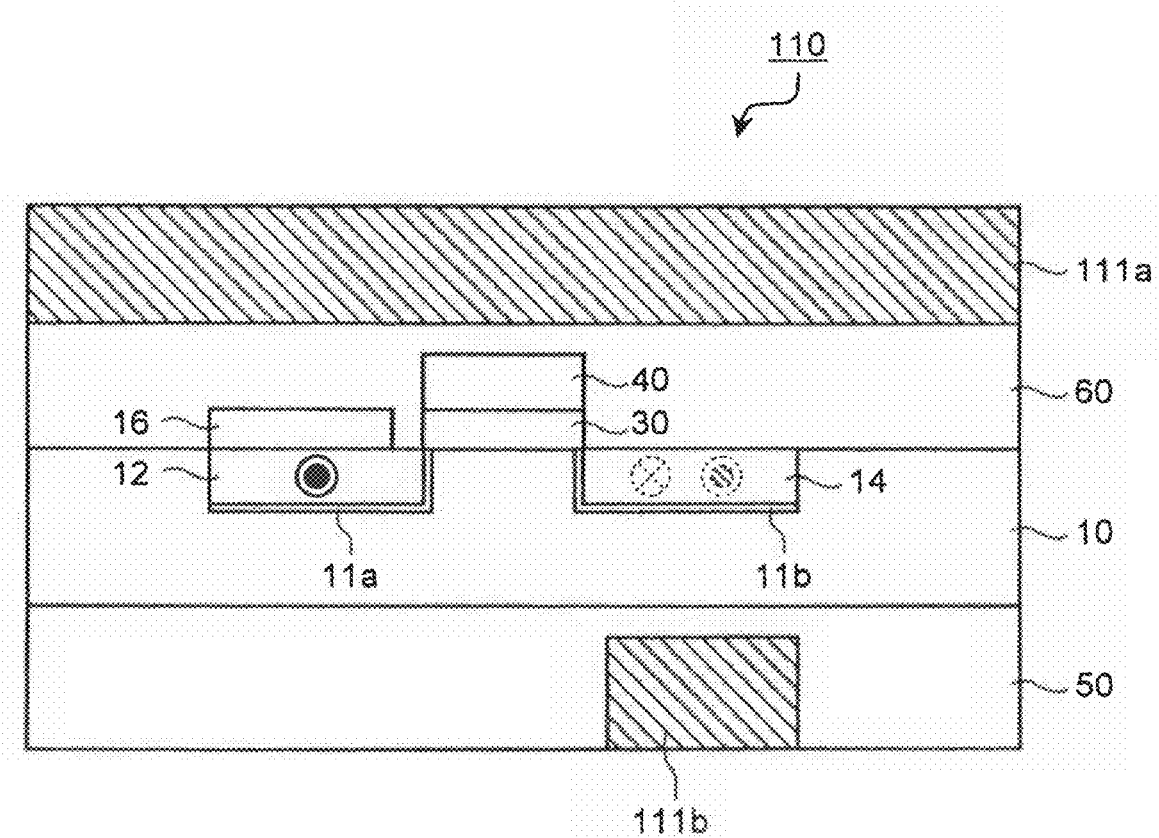
FIG. 7 is a schematic cross-sectional view of a spin transistor according to a second embodiment of the present invention.

A spin transistor according to a second embodiment of the present invention characteristically has a structure that utilizes the current magnetic field so as to control the magnetizing direction of the second conductive layer 14 shown in FIG. 1. FIG. 7 is a schematic cross-sectional view of the spin transistor according to the second embodiment. This spin transistor 110 has an insulating film 60 covering the antiferromagnetic layer 16, the gate electrode 40, the upper surface of the semiconductor substrate layer 10, and the side surfaces of the gate insulating film 30. The spin transistor 110 differs from the spin transistor 100 of FIG. 1 in that a first word line 111a is formed on the insulating layer 60, the semiconductor substrate layer 10 and a silicon oxide layer 50 are provided to form a part of a SOI (Silicon On Insulator) substrate, and a second word line 111b is formed in the silicon oxide layer 50. Although not shown in FIG. 7, a supporting substrate made of a material such as Si is formed under the silicon oxide layer 50.

The first word line 111a and the second word line 111b sandwich the second conductive layer 14 and are substantially perpendicular to each other. The first word line 111a and the second word line 111b are made of Al or Cu, for example. In the structure shown in FIG. 7, the first word line 111a extends in a direction that intersects with the first conductive layer 12 and the second conductive layer 14, while the second word line 111b extends along the second conductive layer 14.

A current pulse is applied to each of the first word line 111a and the second word line 111b, so as to generate a synthetic magnetic field in a region that is sandwiched by the first word line 111a and the second word line 111b, or the region in which the second conductive layer 14 is located. The direction of the synthetic magnetic field can be controlled by adjusting the direction of the current pulse. By doing so, the magnetizing direction of the second conductive layer 14 can be controlled.

Thus, with the spin transistor 110 according to the second embodiment, the magnetizing direction of the second conductive layer 14 that is the same as the second conductive layer 14 of the spin transistor 100 according to the first embodiment can be controlled by adjusting the current magnetic field.

The current magnetic field controlling mechanism can also be applied to the surface laminated MOS-type spin transistor illustrated in FIG. 5.

Figure 8A:
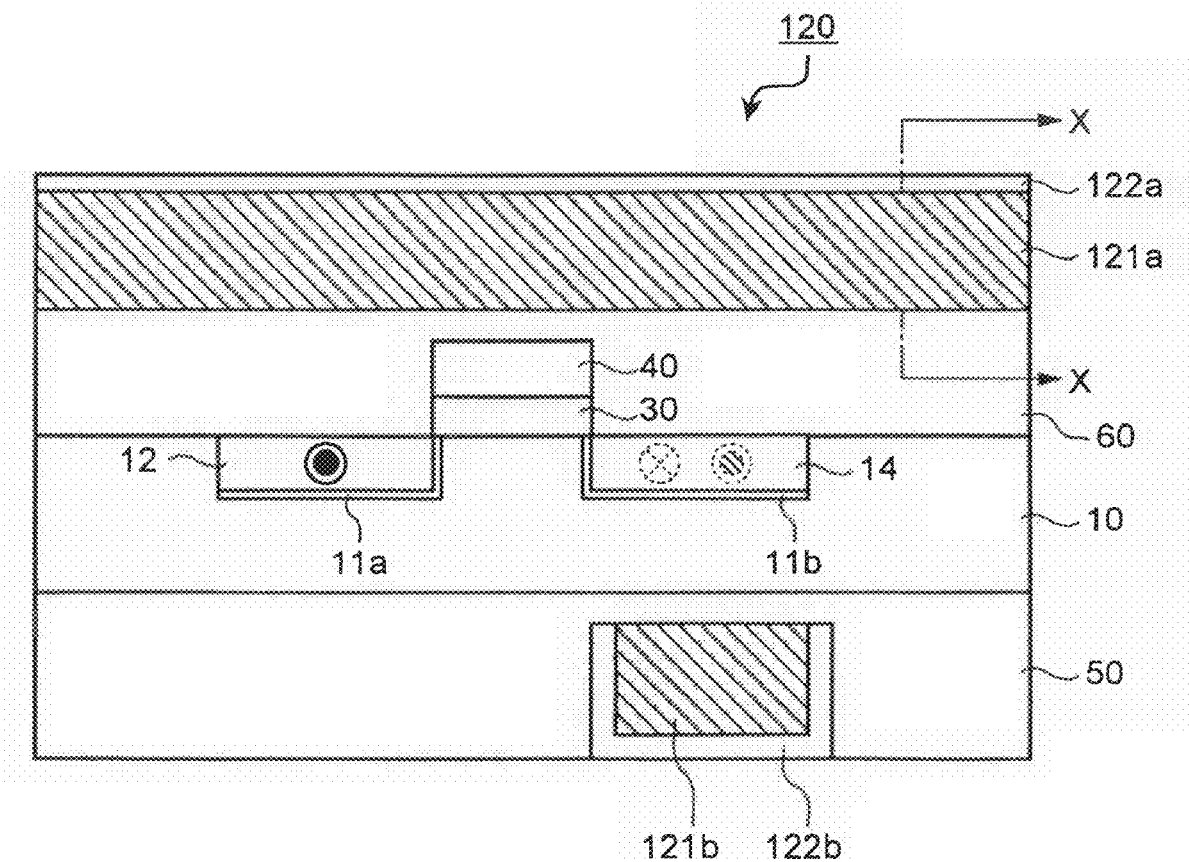
FIG. 8A is a schematic cross-sectional view of a spin transistor according to a third embodiment of the present invention.
Figure 8B:
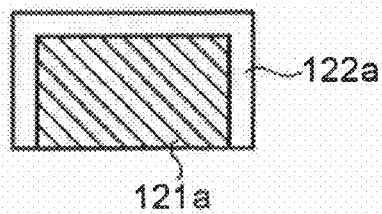
FIG. 8B is a cross-sectional view of the structure, taken along the line X-X of FIG. 8A.

A spin transistor according to a third embodiment of the present invention is the same as the spin transistor according to the second embodiment, except that a magnetic cover layer is formed on a part of the surface of the first word line and/or the second word line. The magnetic cover layer is made of a magnetic material. FIG. 8A is a schematic cross-sectional view of the spin transistor according to the third embodiment. This spin transistor 120 differs from the structure shown in FIG. 7 in that a magnetic cover layer (Yoke) 122a is formed on the upper surface and the side surfaces of a first word line 121a formed on the insulating layer 60, and a magnetic cover layer (Yoke) 122b is formed on the lower surface and the side surfaces of a second word line 121b formed within the silicon oxide layer 50. The magnetic cover layers 122a and 122b are made of permalloy, for example. FIG. 8B is a cross-sectional view, taken along the line X-X of FIG. 8A. As shown in FIGS. 8A and 8B, the section of each of the magnetic cover layers 122a and 122b has a U-like shape. The magnetic cover layers 122a and 122b are not formed on the surfaces that face the second conductive layer 14 among the surfaces of the first word line 121a and the second word line 121b.

With the spin transistor 120 according to the third embodiment, the magnetic cover layers 122a and 122b formed over the first word line 121a and the second word line 121b provide a current magnetic field locally to the second conductive layer 14. In other words, the necessary current pulse to control the magnetizing direction of the second conductive layer 14 can be made smaller. Thus, the problems that are caused by an increase in current pulse, such as EM (Electro Migration) and an increase in the area of a current pulse generating circuit, can be prevented.

FIG. 9 is a graph showing the drain current characteristics of a spin transistor according to the third embodiment. The first conductive layer 12 of the spin transistor used to prepare the graph is a ferromagnetic multi-layer film of $(Co_{90}Fe_{10})_{85}B_{15}$/PtMn/Ta/Poly-si, while the second conductive layer 14 is a ferromagnetic multi-layer film of $(CO_{90}Fe_{10})_{85}B_{15}$/Ta/Poly-Si. In FIG. 9, the solid lines indicate the cases where the magnetizing direction of the second conductive layer 14 is "parallel" to the magnetizing direction of the first conductive layer 12. The broken lines indicate the cases where the magnetizing direction of the second conductive layer 14 is "antiparallel" to the magnetizing direction of the first conductive layer 12. The graph shown in FIG. 9 shows the cases where the two magnetizing directions are "parallel" or "antiparallel" to each other, and the gate voltage Vg is varied 0.2 V, 0.6 V, 0.9 V, and 1.4 V. As can be seen from FIG. 9, in the case where the two magnetizing directions are "parallel" to each other, sufficient drain current can be obtained by applying a lower source-drain voltage than in the case where the two magnetizing directions are "antiparallel" to each other. In short, the "parallel" state and the "antiparallel" state exhibit different current characteristics, and accordingly, a memory function is realized. Also, as the gate voltage increases, the drain current increases. This implies that the spin transistor 120 has an amplifying function.

FIG. 10 is a graph showing the drain current characteristics of another example of a spin transistor according to the third embodiment. The first conductive layer 12 and the second conductive layer 14 of the spin transistor used to prepare the graph are multi-layer films that is made of $CO_2MnAl$, which is a half metal material. More specifically, the first conductive layer 12 is a ferromagnetic multi-layer film of $CO_2MnAl/(Co_{90}Fe_{10})_{85}B_{15}$/PtMn/Ta/Poly-Si, while the second conductive layer 14 is a ferromagnetic multi-layer film of $CO_2MnAl/(Co_{90}Fe_{10})_{85}B_{15}$/Cu/$(CO_{90}Fe_{10})_{85}B_{15}$/PtMn/Ta/Poly-Si.

The graph shown in FIG. 10 shows the cases where the two magnetizing directions are "parallel" or "antiparallel" to each other, and the gate voltage Vg is varied 0.4 V, 0.8 V, 1.2 V, and 1.5 V. In FIG. 10, the same drain current characteristics as those shown in FIG. 9 are shown. As can be seen from FIG. 10, however, in the case where the two magnetizing directions are "antiparallel" to each other, sufficient drain current is obtained. Therefore, a higher source-drain voltage than in the cases shown in FIG. 9 needs to be applied. This means that the first conductive layer 12 and the second conductive layer 14 are made of a half metal material so that a higher MR ratio is obtained.

Figure 11A:
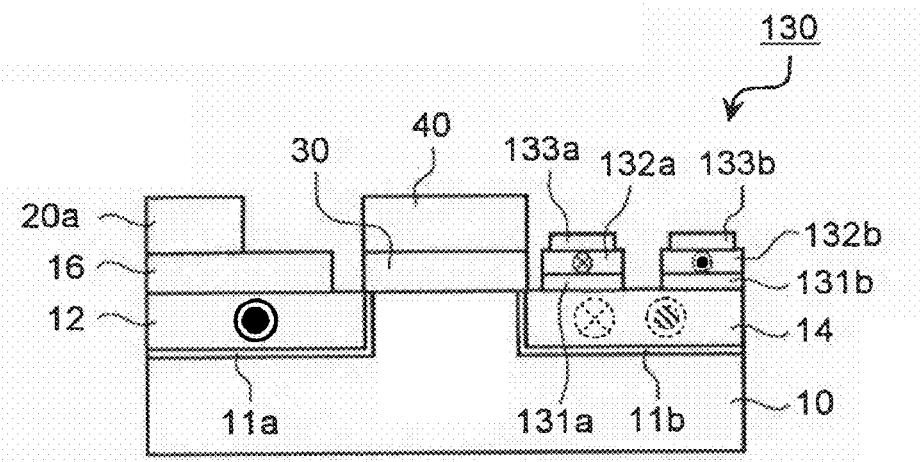
FIG. 11A is a schematic cross-sectional view of a spin transistor according to a fourth embodiment of the present invention.
Figure 11B:
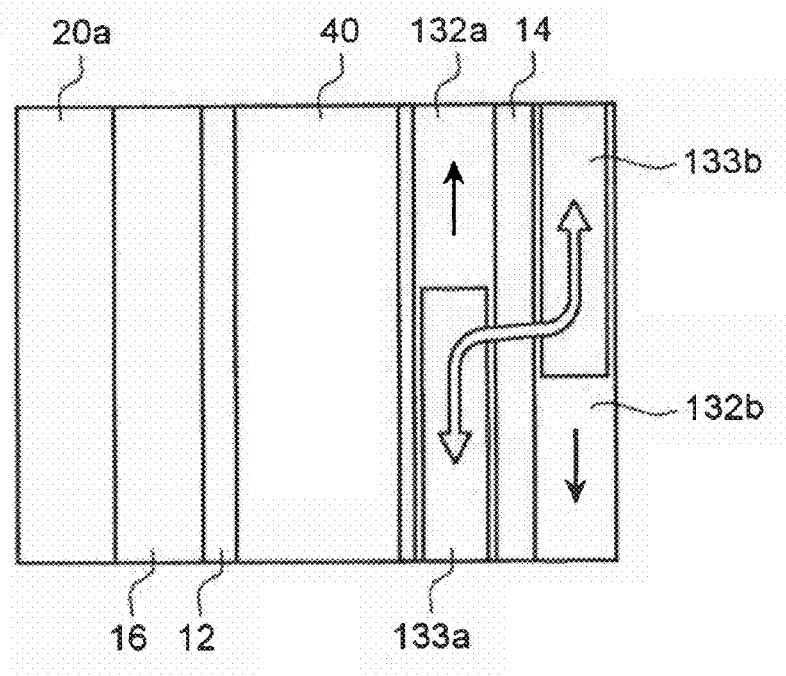
FIG. 11B is a plan view of the spin transistor shown in FIG. 11A.

A spin transistor according to a fourth embodiment of the present invention is characteristically the same as the spin transistor according to the first embodiment, except that the magnetizing direction of the second conductive layer 14 is controlled through spin injection. FIG. 11A is a schematic cross-sectional view of the spin transistor according to the fourth embodiment. FIG. 11B is a plan view of the spin transistor of FIG. 11A. This spin transistor 130 differs from the spin transistor 100 of FIG. 1 in that a first multi-layer film and a second multi-layer film are formed at a predetermined distance from each other.

As shown in FIG. 11A, the spin transistor 130 has a non-magnetic layer 131a and a magnetism fixing layer 132a stacked in this order as the first multi-layer film on the surface of the second conductive layer 14. The spin transistor 130 also has a non-magnetic layer 131b and a magnetism fixing layer 132b stacked in this order as the second multi-layer film on the surface of the second conductive layer 14. Particularly, the first multi-layer film and the second multi-layer film extend in the longitudinal direction of the second conductive layer 14, and run parallel to each other. Accordingly, the gap between the first multi-layer film and the second multi-layer film also extends in the longitudinal direction of the second conductive layer 14. The magnetism fixing layers 132a and 132b have magnetizing directions "antiparallel" to each other, and are made of the same magnetic material as the first conductive layer 12. The non-magnetic layers 131a and 131b may be made of Ag, Cu, Au, Al, Ru, Os, Re, Si, Bi, Ta, B, C, Pd, Pt, Zr, Ir, W, Mo, or Nb, or an alloy of any of those materials, for example.

Also, an electrode 133a is formed on the magnetism fixing layer 132a, and an electrode 133b is formed on the magnetism fixing layer 132b. The electrodes 133a and 133b are made of aluminum or polycrystalline silicon, for example.

The spin injection to the second conductive layer 14 is performed by applying current between the electrode 133a and the electrode 133b. In the following, the control on the magnetizing direction through the spin injection is described. Here, the magnetizing direction of the magnetism fixing layer 132a is "antiparallel" to the magnetizing direction of the first conductive layer 12, while the magnetizing direction of the magnetism fixing layer 132b is "parallel" to the magnetizing direction of the first conductive layer 12, as shown in FIG. 11A.

First, a situation in which the magnetizing direction of the second conductive layer 14 is "parallel" to the magnetizing direction of the first conductive layer 12 is described. Spin injection is then performed to reverse the magnetizing direction of the second conductive layer 14 from the "parallel" direction to the "antiparallel" direction. This magnetism reversal is performed by applying current from the electrode 133b to the electrode 133a. In terms of electron movement, the electron spin that is polarized in the "antiparallel" direction in the magnetism fixing layer 132a (hereinafter referred to as the "antiparallel spin") is injected into the second conductive layer 14 via the non-magnetic layer 131a. The electron spin polarized in the "parallel" direction in the second conductive layer 14 (hereinafter referred to the "parallel spin") is subjected to the torque of the injected antiparallel spin, so that the spin direction is reversed to the antiparallel direction. The antiparallel spin that reaches the magnetism fixing layer 132b through the injection is reflected there, because the magnetizing direction of the magnetism fixing layer 132b is the "parallel" direction. The reflected antiparallel spin gives torque to the parallel spin in the second conductive layer 14, thereby reversing the spin direction of the "parallel" spin to the "antiparallel" direction. Thus, the magnetizing direction of the second conductive layer 14 can be reversed from the "parallel" direction to the "antiparallel" direction.

The current $I_C^{AP}$ that is required in the "parallel" to "antiparallel" operation can be expressed as:

$$I_C^{AP}=e \cdot \alpha M \cdot A_t [H+H_k+2\pi M]/(h \cdot g(0))$$

where α represents the Gilbert damping parameter, M represents the magnetization, $A_t$ represents the volume of the second conductive layer 14, H represents the magnetic field, $H_k$ represents the anisotropic constant, and h represents the Planck's constant. The general formula g(π) of g(0) represents the spin dependency at the interface between the magnetism fixing layer 132a and the non-magnetic layer 131a and at the interface between the magnetism fixing layer 132b and the non-magnetic layer 131b. This can be expressed as:

$$g(\theta)=1/[-4+(1+p)^3 \cdot (3+\cos\theta)/4p^{3/2}]$$

where p represents the spin polarization rate.

Next, a situation in which the magnetizing direction of the second conductive layer 14 is "antiparallel" to the magnetizing direction of the first conductive layer 12 is described. Spin injection is then performed to reverse the magnetizing direction of the second conductive layer 14 from the "antiparallel" direction to the "parallel" direction. This magnetism reversal is performed by applying current from the electrode 133a to the electrode 133b, which is the opposite from the process in the above described "parallel" to "antiparallel" operation. In terms of electron movement, the parallel spin in the magnetism fixing layer 132b is injected into the second conductive layer 14 via the non-magnetic layer 131b. This reversing process is the same as the corresponding process in the above described "parallel" to "antiparallel" operation, except that the spin direction is different.

The current $I_C^P$ that is required in the "antiparallel" to "parallel" operation can be expressed as:

$$I_C^P=e \cdot \alpha \cdot M \cdot A_t [H-H_k-2\pi M]/(h \cdot g(\pi))$$

Since g(π) is greater than g(0), the current $I_C^P$ is generally smaller than the current $I_C^{AP}$.

Figure 12:
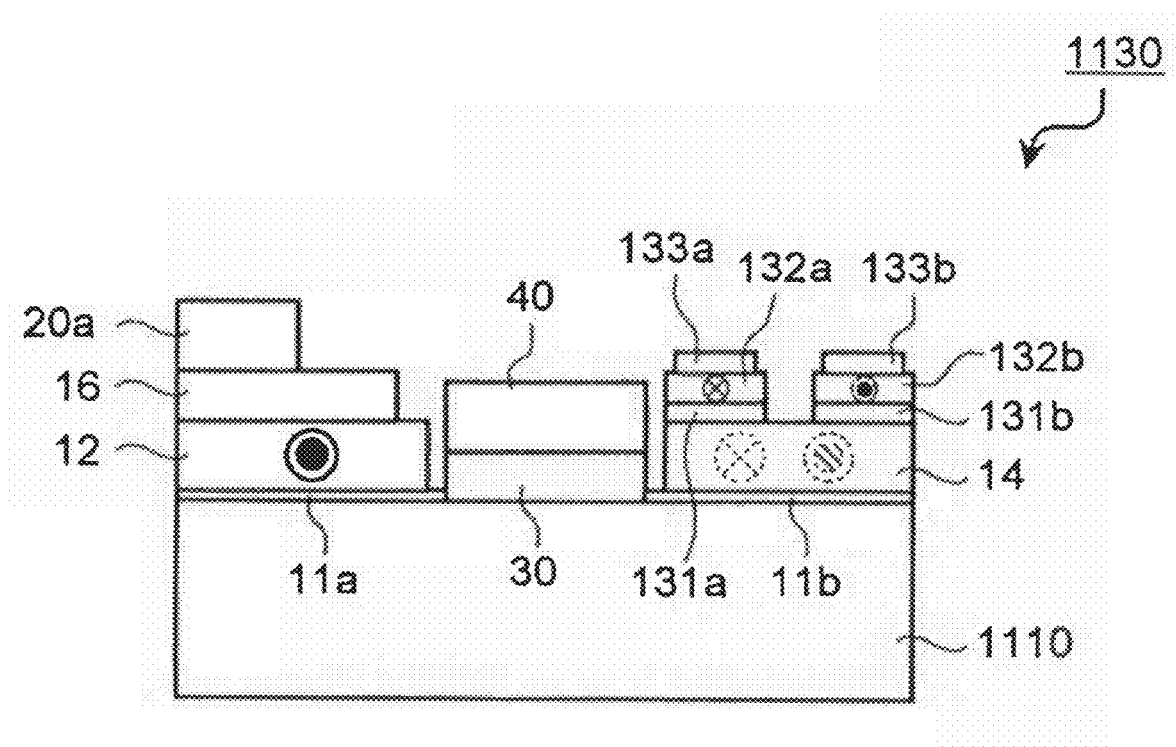
FIG. 12 is a schematic cross-sectional view of another example of a spin transistor according to the fourth embodiment.

The magnetizing direction controlling structure illustrated in FIGS. 11A and 11B can be applied to the above described surface laminated MOS structure, as shown in FIG. 12. A spin transistor 1130 illustrated in FIG. 12 has the first conductive layer 12 and the second conductive layer 14 formed on the tunnel barrier films 11a and 11b formed on the semiconductor substrate 1110, respectively. Further, the first multi-layer film (the non-magnetic layer 131a and the magnetism fixing layer 132a) and the second multi-layer film (the non-magnetic layer 131b and the magnetism fixing layer 132b) that are shown in FIGS. 11A and 11B are formed on the second conductive layer 14.

Figure 13A:
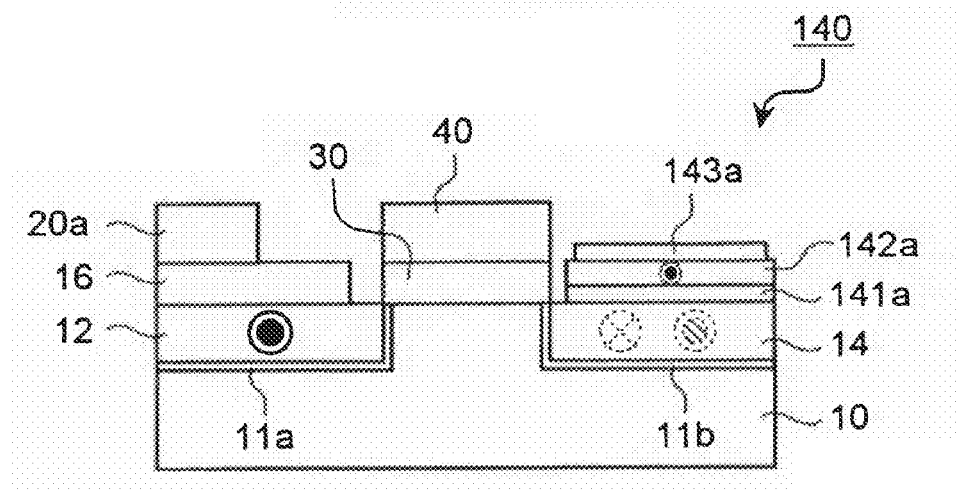
FIG. 13A is a schematic cross-sectional view of yet another example of a spin transistor according to the fourth embodiment.
Figure 13B:
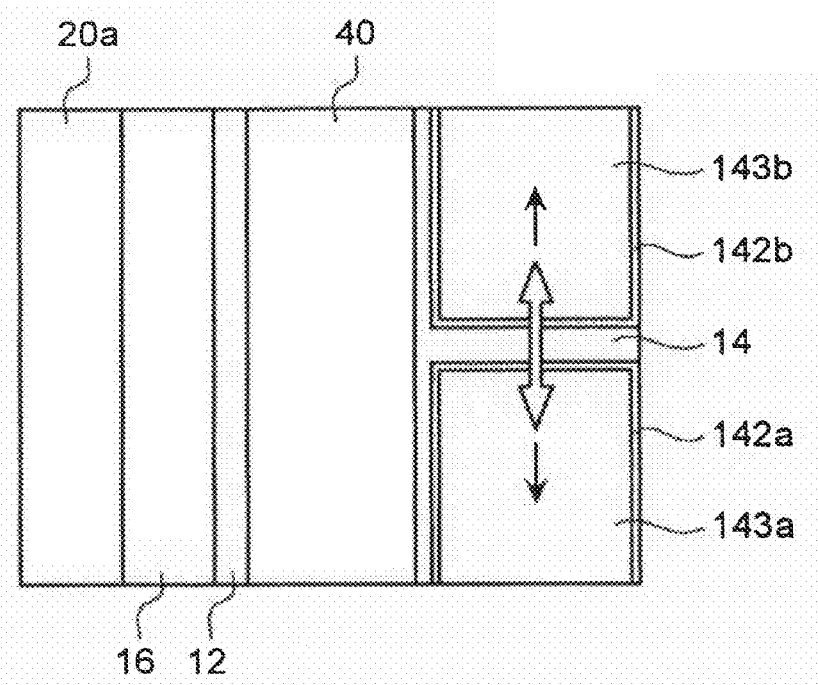
FIG. 13B is a plan view of the spin transistor shown in FIG. 13A.

Although in FIGS. 11A and 11B, the first multi-layer film and the second multi-layer film extend in parallel with each other in the longitudinal direction of the second conductive layer 14, it is possible to rotate the arrangement by 90 degrees and allow a gap between the top end of the first multi-layer film and the top end of the second multi-layer film. FIG. 13A is a schematic cross-sectional view of a spin transistor of this version of the fourth embodiment. FIG. 13B is a plan view of the spin transistor shown in FIG. 13A. A spin transistor 140 illustrated in FIG. 13A has a non-magnetic layer 141a and a magnetism fixing layer 142a stacked in this order on the surface of the second conductive layer 14 as the first multi-layer film. The spin transistor 140 also has a non-magnetic layer (not shown) and a magnetism fixing layer 142b stacked in this order on the surface of the second conductive layer 14 as the second multi-layer film. Particularly, the first multi-layer film and the second multi-layer film are disposed in such a manner that the top ends of the films face each other, and a gap is formed between the top ends. The magnetism fixing layers 142a and 142b are made of the same material as the magnetism fixing layers 132a and 132b shown in FIG. 11A. The non-magnetic layers 141a and 141b are also made of the same material as the non-magnetic layers 131a and 131b shown in FIG. 11A. An electrode 143a is formed on the magnetism fixing layer 142a, while an electrode 143b is formed on the magnetism fixing layer 142b. These electrodes 143a and 143b are also made of the same material as the electrodes 133a and 133b shown in FIG. 11A.

The magnetizing direction controlling structure illustrated in FIGS. 13A and 13B can be applied to the above described surface laminated MOS structure, as shown in FIG. 14. A spin transistor 1140 illustrated in FIG. 14 has the first conductive layer 12 and the second conductive layer 14 formed on the tunnel barrier films 11a and 11b formed on the semiconductor substrate 1110, respectively. Further, the first multi-layer film (the non-magnetic layer 141a and the magnetism fixing layer 142a) and the second multi-layer film (the non-magnetic layer and the magnetism fixing layer 142b) that are shown in FIGS. 13A and 13B are formed on the second conductive layer 14.

As described above, in any of the spin transistors 130, 1130, 140, and 1140 of the fourth embodiment, the magnetizing direction of the second conductive layer 14 can be controlled through spin injection. The synthetic magnetic field generated from the current magnetic field in any structure described in the second and third embodiments takes up a three-dimensional space, regardless of the layer structure of the spin transistor. This might adversely affect the other components than the second conductive layer 14. Also, in addition to the space taken up by the MOS structure, it is necessary to prepare a space for word lines. In any of the spin transistors of the fourth embodiment, those problems with the structure that generates a current magnetic field are improved. Further, spin injection is performed in the plane direction of the second conductive layer 14. Accordingly, the electron spin injected so as to control the magnetizing direction does not flow through the tunnel barrier films 11a and 11b. Thus, the tunnel barrier films 11a and 11b can be prevented from breaking.

In the structure illustrated in FIG. 11A, an antiferromagnetic layer that is made of the same material as the antiferromagnetic layer 16 may be formed between the magnetism fixing layer 132a and the electrode 133a and also between the magnetism fixing layer 132b and the electrode 133b. With this arrangement, the magnetization of the magnetism fixing layer 132a and the magnetism fixing layer 132b can be firmly and stably maintained. The same applies to each of the spin transistors illustrated in FIGS. 12, 13A, and 14.

The spin injecting structure that is a characteristic feature of the fourth embodiment can be applied to a structure that does not include the tunnel barrier films 11a and 11b. In other words, the magnetizing direction of the second conductive layer 14 can be controlled through spin injection also in a MOS-type spin transistor that generates a Schottky barrier between the channel and the first and second conductive layers 12 and 14.

A spin transistor according to a fifth embodiment of the present invention is the same as a spin transistor according to the fourth embodiment, except that the magnetism fixing layer of at least one of the magnetic multi-layer film has a three-layer structure of a magnetic layer, a non-magnetic layer, and another magnetic layer.

Figure 15A:
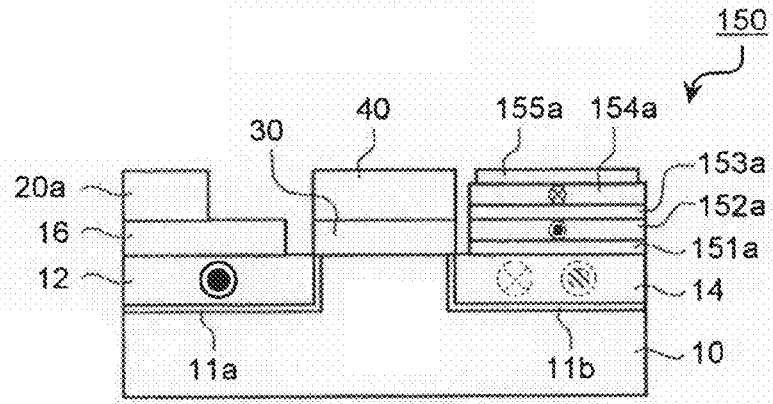
FIG. 15A is a schematic cross-sectional view of a spin transistor according to a fifth embodiment of the present invention.
Figure 15B:
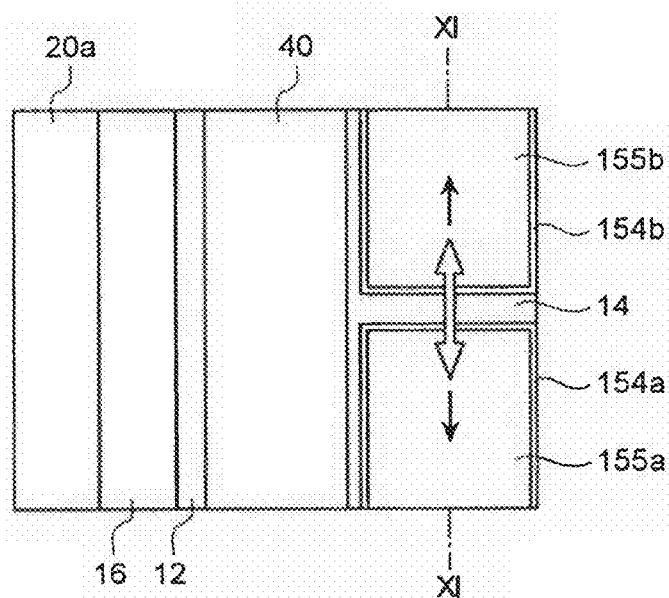
FIG. 15B is a plan view of the spin transistor shown in FIG. 15A.
Figure 15C:
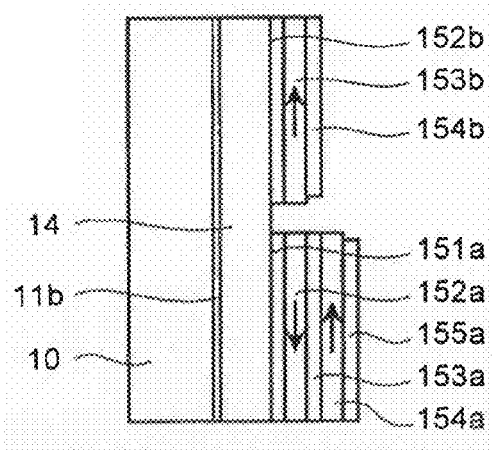
FIG. 15C is a cross-sectional view of the spin transistor, taken along the line X1-X1 of FIG. 15B.

FIG. 15A is a schematic cross-sectional view of the spin transistor according to the fifth embodiment. FIG. 15B is a plan view of the spin transistor shown in FIG. 15A. FIG. 15C is a cross-sectional view of the spin transistor, taken along the line X1-X1 of FIG. 15B. The spin transistor 150 illustrated in FIG. 15A differs from the spin transistor 140 of FIG. 13A in that a non-magnetic layer 151a, a magnetic layer 152a, a non-magnetic layer 153a, and a magnetic layer 154a are stacked in this order as a first multi-layer film on the surface of the second conductive layer 14, and a non-magnetic layer 152b and a magnetic layer 153b are stacked in this order as a second multi-layer film on the surface of the second conductive layer 14. The magnetizing direction of the magnetic layer 152a and the magnetizing direction of the magnetic layer 153b are "antiparallel" to each other, while the magnetizing direction of the magnetic layer 154a and the magnetizing direction of the magnetic layer 153b are "parallel" to each other. More specifically, the two magnetic layers 152a and 154a of the first multi-layer film have different magnetizing directions.

The magnetic layers 152a, 154a, and 153b are made of the same material as the magnetism fixing layers described in the fourth embodiment. The non-magnetic layers 151a, 153a, and 152b are also made of the same material as the non-magnetic layers described in the fourth embodiment. An electrode 155a is formed on the magnetic layer 154a, while an electrode 154b is formed on the magnetic layer 153b. These electrodes 155a and 154b are also made of the same material as the above described electrodes.

Like the combination of the magnetic layer 152a, the non-magnetic layer 153a, and the magnetic layer 154a, a non-magnetic layer is sandwiched by two magnetic layers of different magnetizing directions, so that an antiferromagnetic interaction is caused between the two magnetic layers, and the magnetizing directions of the magnetic layers are more firmly and stably maintained. Accordingly, this three-layer structure can provide the same function as the antiferromagnetic layer 16 formed on the first conductive layer 12. It is more effective to dispose an antiferromagnetic layer next to this three-layer structure. It is also possible to adjust the film thicknesses of the two magnetic layers of a magnetism fixing layer formed with a magnetic layer, a non-magnetic layer, and a magnetic layer, so as to arbitrarily set the magnetizing shift of the second conductive layer 14 that is a magnetic recording layer. The magnetism fixing to be performed with this three-layer structure can reduce the stray field from the magnetic layers.

The second multi-layer film may be formed with a three-layer structure consisting of a magnetic layer, a non-magnetic layer, and a magnetic layer. In such a case, either the first multi-layer film or the second multi-layer film is formed with a multi-layer structure that is formed by stacking an odd number of combined layers of a non-magnetic layer and a magnetic layer. Here, the other one of the first multi-layer film and the second multi-layer film needs to be a multi-layer structure that is formed by stacking an even number of combined layers of a non-magnetic layer and a magnetic layer.

The magnetization fixing by virtue of the three-layer structure can also be applied to the first conductive layer 12 that is a magnetism fixing layer. More specifically, the structure formed with the first conductive layer 12 and the antiferromagnetic layer 16 may be formed with a three-layer structure consisting of a magnetic layer, a non-magnetic layer, and a magnetic layer. Further, the antiferromagnetic layer 16 may be disposed next to the three-layer structure.

Figure 16:
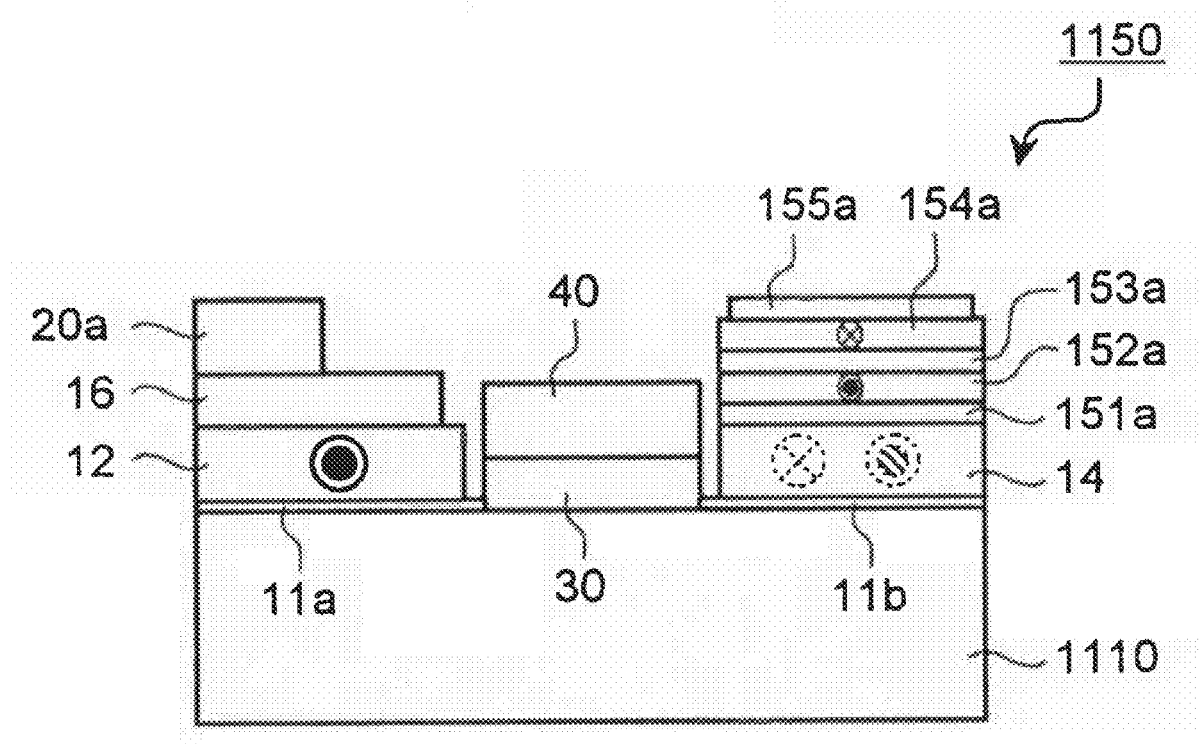
FIG. 16 is a schematic cross-sectional view of another example of a spin transistor according to the fifth embodiment.

The magnetizing direction controlling structure illustrated in FIGS. 15A through 15C can be applied to the above described surface laminated MOS structure, as shown in FIG. 16. A spin transistor 1150 illustrated in FIG. 16 has the first conductive layer 12 and the second conductive layer 14 formed on the tunnel barrier films 11a and 11b formed on the semiconductor substrate 1110, respectively. Further, the first multi-layer film (the non-magnetic layer 151a, the magnetic layer 152a, the non-magnetic layer 153a, and the magnetic layer 154a) and the second multi-layer film (the non-magnetic layer 152b and the magnetism fixing layer 153b) that are shown in FIGS. 13A and 13B are formed on the second conductive layer 14.

As described above, in either of the spin transistors 150 and 1150 according to the fifth embodiment, the magnetism fixing layer for performing spin injection onto the second conductive layer 14 is formed with a three-layer structure consisting of a magnetic layer, a non-magnetic layer, and a magnetic layer. With this three-layer structure, the magnetization of the magnetism fixing layer can be more firmly and steadily maintained.

Figure 17A:
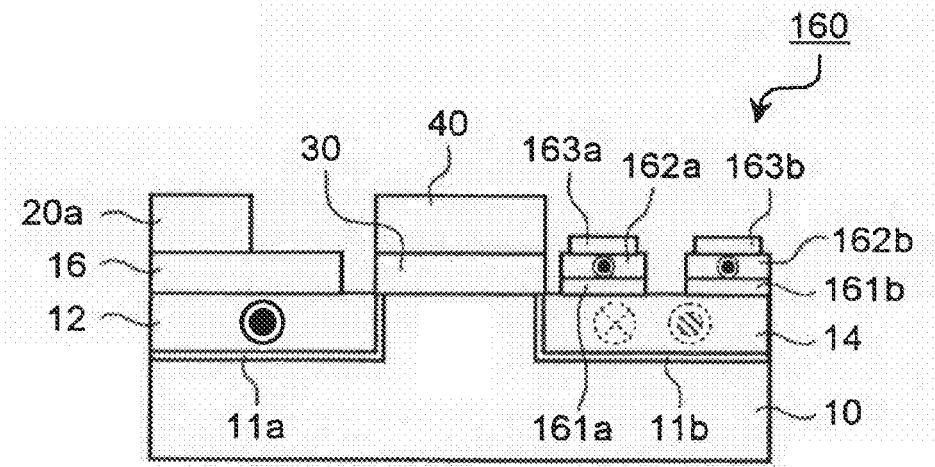
FIG. 17A is a schematic cross-sectional view of a spin transistor according to a sixth embodiment of the present invention.
Figure 17B:
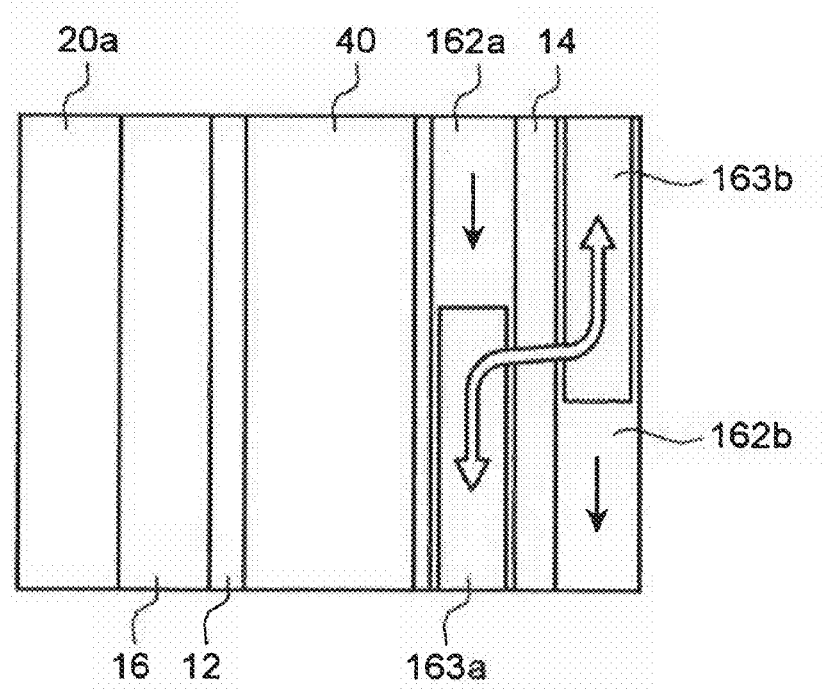
FIG. 17B is a plan view of the spin transistor shown in FIG. 17A.

A spin transistor according to a sixth embodiment of the present invention is the same as a spin transistor according to the fourth embodiment, except that the magnetizing direction of the magnetism fixing layer of the first multi-layer film is the same as the magnetizing direction of the magnetism fixing layer of the second multi-layer film. Particularly, the spin transistor according to this embodiment characteristically has a reflux magnetic domain generated in the second conductive layer 14 through spin injection. FIG. 17A is a schematic cross-sectional view of the spin transistor according to the sixth embodiment. FIG. 17B is a plan view of the spin transistor shown in FIG. 17A.

The spin transistor 160 has a non-magnetic layer 161a and a magnetism fixing layer 162a stacked in this order as the first multi-layer film on the surface of the second conductive layer 14. This spin transistor 160 also has a non-magnetic layer 161b and a magnetism fixing layer 162b stacked in this order as the second multi-layer film on the surface of the second conductive layer 14. An electrode 163a is formed on the magnetism fixing layer 162a, while an electrode 163b is formed on the magnetism fixing layer 162b. The spin transistor 160 has the same structure as the spin transistor 130 illustrated in FIG. 11A, except that the magnetizing directions of the magnetism fixing layers 162a and 162b are the same. Also, the spin transistor 160 is made of the same materials as the spin transistor 130 illustrated in FIG. 11A.

In the following, the magnetizing direction controlling operation through spin injection, especially the process of generating a reflux magnetic domain, will be described. In the example case described below, the magnetizing directions of the magnetism fixing layers 162a and 162b are "parallel" with respect to the magnetizing direction of the first conductive layer 12.

Figure 18A:
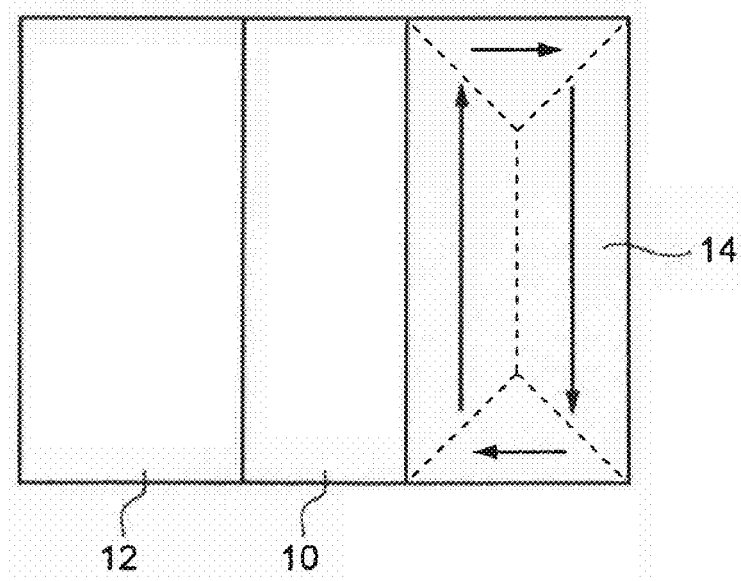
FIG. 18A illustrates the reflux magnetic domain of the second conductive layer having the magnetizing direction in the "antiparallel" state.

First, a situation in which the magnetizing direction of the second conductive layer 14 is "antiparallel" with respect to the magnetizing direction of the first conductive layer 12 is described. More specifically, a reflux magnetic domain is generated in the second conductive layer 14, and the magnetizing direction of the magnetic domain located on the channel side of the reflux magnetic domain or the magnetic domain located immediately below the non-magnetic layer 161a (the magnetic domain will be hereinafter referred to as the proximate magnetic domain) is in the "antiparallel" state. Also, the magnetizing direction of the magnetic domain located immediately below the non-magnetic layer 161b (the magnetic domain will be hereinafter referred to as the distant magnetic domain) is in the "parallel" state. FIG. 18A illustrates a reflux magnetic domain in this situation. In the case where a reflux magnetic domain is formed in the second conductive layer 14, the second conductive layer 14 is either "antiparallel" or "parallel" with respect to the first conductive layer 12. However, the flowing capacity of the drain current is substantially determined by the magnetizing direction of the first conductive layer 12 and the magnetizing direction of the proximate magnetic domain of the second conductive layer 14. Accordingly, the recording state of the second conductive layer 14 can be represented by the magnetizing direction of the proximate magnetic domain.

Figure 18B:
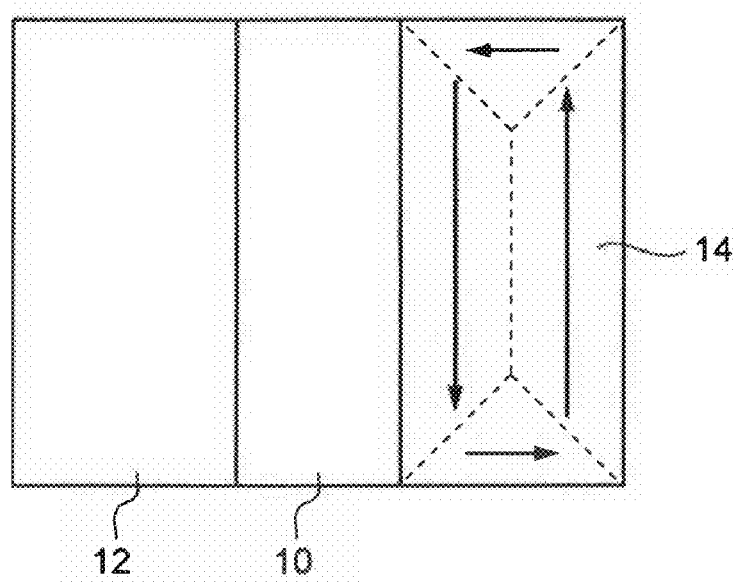
FIG. 18B illustrates the reflux magnetic domain of the second conductive layer having the magnetizing direction in the "parallel" state.

In the situation illustrated in FIG. 18A, the magnetizing direction of the proximate magnetic domain is reversed to the "parallel" direction through spin injection, and the magnetizing direction of the distant magnetic domain is reversed to the "antiparallel" direction. This magnetization reversal is performed by applying current from the electrode 163b to the electrode 163a. In terms of electron movement, the parallel spin in the magnetism fixing layer 162a is injected into the second conductive layer 14 via the non-magnetic layer 161a. The antiparallel spin in the proximate magnetic domain is subjected to the torque of the injected parallel spin, and is thereby reversed to the parallel spin. The injected parallel spin passes through the proximate magnetic domain and the distant magnetic domain, and reaches the magnetism fixing layer 162b. Since the magnetizing direction of the magnetism fixing layer 162b is "parallel", the parallel spin is not reflected, and easily flows to the electrode 163b. Meanwhile, voltage is applied between the electrode 163a and the electrode 163b, so that the antiparallel spin in the second conductive layer 14, as well as the parallel spin, is moved to the magnetism fixing layer 162b. As the magnetizing direction of the magnetism fixing layer 162b is "parallel", the antiparallel spin that has reached the magnetism fixing layer 162b is reflected there. The reflected antiparallel spin gives torque to the parallel spin in the distant magnetic domain, thereby reversing the direction to the "antiparallel" direction. Accordingly, the magnetizing direction of the proximate magnetic domain can be reversed to the "parallel" direction, and the magnetizing direction of the distant magnetic domain can be reversed to the "antiparallel" direction. FIG. 18B shows the reflux magnetic domain after the magnetization reversal. As can be seen from a comparison between FIGS. 18A and 18B, the spin injection from the magnetism fixing layer 162a to the second conductive layer 14 can reverse the magnetizing direction of the reflux magnetic domain from the clockwise direction to the counterclockwise direction.

Next, a situation in which the magnetizing direction of the second conductive layer 14 is "parallel" with respect to the magnetizing direction of the first conductive layer 12 is described. Such a situation is illustrated in FIG. 18B. This magnetization reversal is performed by applying current flowing from the electrode 163a to the electrode 163b. In terms of electron movement, the parallel spin in the magnetism fixing layer 162b is injected into the second conductive layer 14 via the non-magnetic layer 161b. This magnetization reversal is the same as the above described operation of reversing the direction from the "antiparallel" direction to the "parallel" direction, except that the spin direction is different.

The magnetizing direction controlling structure illustrated in FIGS. 18A and 18B can be applied to the above described surface laminated MOS structure, as shown in FIG. 19. A spin transistor 1160 illustrated in FIG. 19 has the first conductive layer 12 and the second conductive layer 14 formed on the tunnel barrier films 11a and 11b formed on the surface of the semiconductor substrate 1110, respectively. Further, the first multi-layer film (the non-magnetic layer 161a and the magnetic layer 162a) and the second multi-layer film (the non-magnetic layer 161b and the magnetism fixing layer 162b) that are shown in FIGS. 17A and 17B are formed on the second conductive layer 14.

As described above, in the spin transistors 160 and 1160 according to the sixth embodiment, a reflux magnetic domain is generated in the second conductive layer 14 through spin injection, and the magnetizing direction of this reflux magnetic domain is controlled so as to adjust the recording state of the second conductive layer 14. Especially, a reflux magnetic domain is advantageous in that it is thermally stable, and accordingly, the problem of spin reversal due to thermal fluctuation caused when the second conductive layer 14 made of a magnetic material becomes smaller in size can be eliminated.

The above described reflux magnetic domain generation and the magnetization reversal can be realized in any of the spin transistors illustrated in FIGS. 13-1 and 14 of according to the fifth embodiment, as long as the magnetizing directions of two magnetic layers disposed on the second conductive layer 14 are fixed in parallel with each other.

Figure 20:
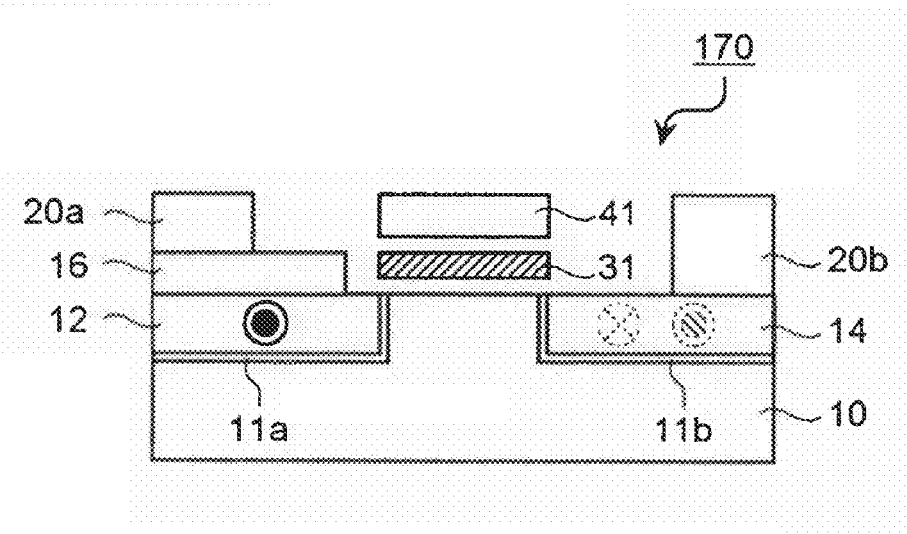
FIG. 20 is a schematic cross-sectional view of a spin transistor that constitutes a programmable logic circuit according to a seventh embodiment of the present invention.

With any of the spin transistors according to the first through sixth embodiments, a programmable logic circuit can be constructed. FIG. 20 is a schematic cross-sectional view of a spin transistor that forms the programmable logic circuit according to a seventh embodiment of the present invention. The spin transistor 170 illustrated in FIG. 20 differs from the spin transistor 100 illustrated in FIG. 1 in that a gate electrode 41 and a floating gate 31 are provided in place of the gate electrode 40 and the gate insulating film 30. The magnetizing direction of the second conductive layer 14 can be controlled by the current magnetic field illustrated in the second and third embodiments or the spin injection illustrated in the fourth through sixth embodiments. In FIG. 20, however, the magnetizing direction controlling structure is not shown.

Figure 21:
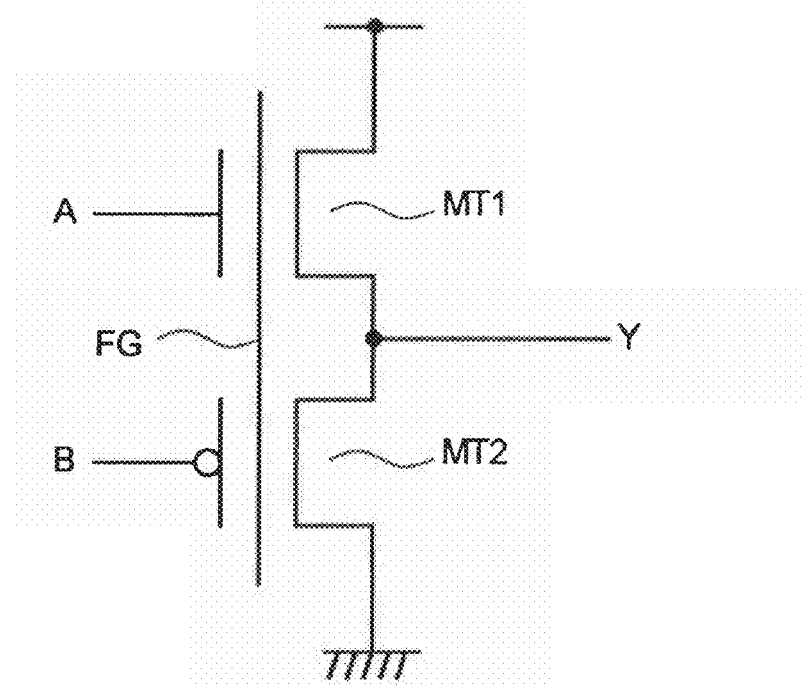
FIG. 21 is an example of a programmable logic circuit that is formed with the spin transistor illustrated in FIG. 20.

FIG. 21 is an example of a programmable logic circuit that is formed with the spin transistor of FIG. 20. The programmable logic circuit illustrated in FIG. 21 includes an N-type spin transistor MT1 and a P-type spin transistor MT2 each having the structure illustrated in FIG. 20. These spin transistors MT1 and MT2 share a floating gate FG. More specifically, the floating gate 31 shown in FIG. 20 is electrically connected to the floating gate of a neighboring spin transistor. The drain (or the source) of the spin transistor MT1 is connected to the source (or the drain) of the spin transistor MT2. The source (or the drain) of the spin transistor MT1 is connected to a power supply voltage, and the drain (or the source) of the spin transistor MT2 is grounded. In this programmable logic circuit, the gate of each of the spin transistors MT1 and MT2 is connected to an input terminal, and the drain of the spin transistor MT1 (namely, the source of the spin transistor MT2) is connected to an output terminal.

Figure 22:
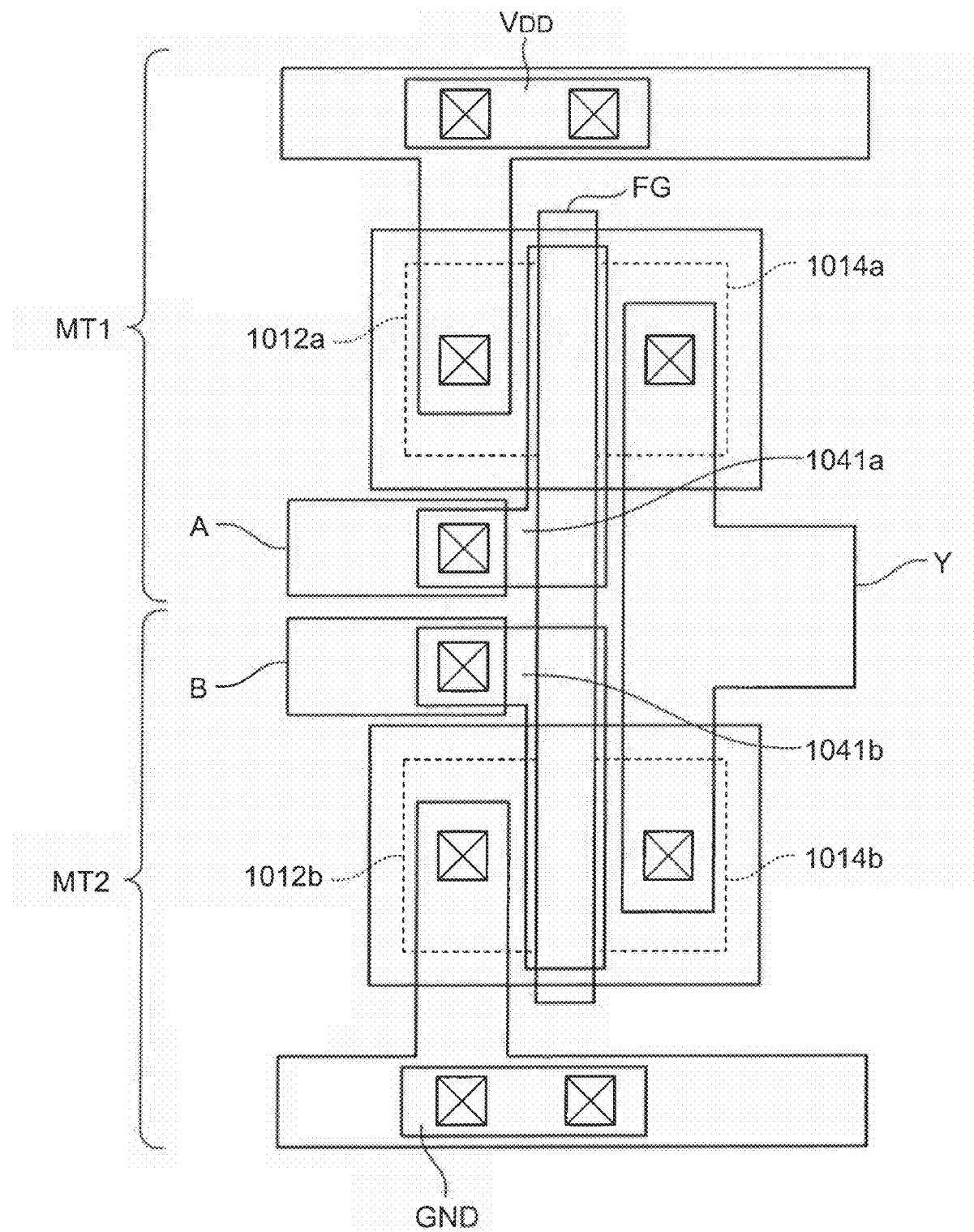
FIG. 22 shows an example layout of the programmable logic circuit illustrated in FIG. 21.

FIG. 22 shows an example layout of the programmable logic circuit illustrated in FIG. 21. In FIG. 22, an N-type diffusion region 1012a is equivalent to the first conductive layer 12, and is made of a diluted magnetic semiconductor material such as SiMn or GeMn in which N-type impurities are diffused. This N-type diffusion region 1012a is connected to a power supply line $V_{DD}$ via a via-hole and a metal wiring layer. An N-type diffusion region 1014a is equivalent to the second conductive layer 14, and is made of a semiconductor ferromagnetic material in which N-type impurities are diffused. This N-type diffusion region 1014a is connected to an output terminal Y via a via-hole and a metal wiring layer. Also, a P-type diffusion region 1012b is equivalent to the first conductive layer 12, and is made of a diluted magnetic semiconductor material such as SiMn or GeMn in which P-type impurities are diffused. This P-type diffusion region 1012b is connected to a ground line GND via a via-hole and a metal wiring layer. A P-type diffusion region 1014b is equivalent to the second conductive layer 14, and is made of a semiconductor ferromagnetic material in which P-type impurities are diffused. This P-type diffusion region 1014b is connected to the output terminal Y via a via-hole and a metal wiring layer. Gate electrodes 1041a and 1041b are equivalent to the gate electrode 41, and are made of polysilicon, for example. The gate electrodes 1041a and 1041b are connected to input terminals A and B, respectively, via via-holes and metal wiring layers.

FIG. 23 is a graph showing the output characteristics of the programmable logic circuit illustrated in FIG. 21, illustrating the relationship between the logic level $V_{fg}$ to be given to the floating gate FG and the logic output Y. With the logic input of the spin transistor MT1 being A, and the logic input of the spin transistor MT2 being B, the relationship can be expressed as:

$$V_{fg}=(A+B)/2$$

In FIG. 23, the solid line indicates the output characteristics in the case where the magnetizing direction of the second conductive layer 14 of each of the spin transistor MT1 and MT2 is in the "parallel" state, and the broken line indicates the output characteristics in the case where the magnetizing direction of the second conductive layer 14 of the spin transistor MT1 is in the "parallel" state while the magnetizing direction of the second conductive layer 14 of the spin transistor MT2 is in the "antiparallel" state. As shown in FIG. 23, the logic output Y of this programmable logic circuit exhibits various characteristics depending on the magnetizing direction of the second conductive layer 14 of each of the spin transistors MT1 and MT2. More specifically, in the case where the logic level $V_{fg}$ of the floating gate FG is ½, namely, in the case where only either the logic input A or the logic input B indicates the logic level "1", the logic output Y is "0" in the "parallel" state, but the logic output Y is "1" in the "antiparallel" state. Utilizing the characteristics, the programmable logic circuit illustrated in FIG. 21 can function as an AND circuit and an OR circuit, depending on the recording state of each of the spin transistors MT1 and MT2.

FIG. 24A is a table showing the input-output relationship in the case where the magnetizing direction of the second conductive layer 14 of each of the spin transistors MT1 and MT2, namely, the spin direction, is "parallel" with respect to the magnetizing direction of the first conductive layer 12 in the programmable logic circuit illustrated in FIG. 21. As can be seen from the table, the relationship between the output Y and the inputs A and B conforms to the truth table of AND logic operations. This means that the programmable logic circuit illustrated in FIG. 21 functions as an AND circuit.

FIG. 24B is a table showing the input-output relationship in the case where the magnetizing direction of the second conductive layer 14 of the spin transistor MT1 or the spin direction is "parallel" with respect to the magnetizing direction of the first conductive layer 12, and the magnetizing direction of the second conductive layer 14 of the spin transistor MT2 is "antiparallel" with respect to the magnetizing direction of the first conductive layer 12 in the programmable logic circuit illustrated in FIG. 21. In this case, the spin transistor MT2 is in a high-impedance state. As can be seen from the table, the relationship between the output Y and the inputs A and B conforms to the truth table of OR logic operations. This means that the programmable logic circuit illustrated in FIG. 21 functions as an OR circuit.

Even if the programmable logic circuit illustrated in FIG. 21 has a circuit structure in which the source (or the drain) of the spin transistor MT1 is grounded, the drain (or the source) of the spin transistor MT2 is connected to the power supply voltage, and the connecting point between the spin transistor MT1 and the spin transistor MT2 is connected to an inverter, the programmable logic circuit can function as an AND circuit or an OR circuit in the same manner as the above. FIG. 25 illustrates such a programmable logic circuit. As shown in FIG. 25, the drain (or the source) of the P-type spin transistor MT2 that inputs the input B into the gate is connected to the power supply voltage, and the source (or the drain) of the N-type spin transistor MT1 that inputs the input A into the gate is grounded. The source (or the drain) of the spin transistor MT2 and the drain (or the source) of the spin transistor MT1 are both connected to the input terminal of the inverter INV. A logic output Y' is obtained from the output terminal of the inverter INV.

FIG. 26A is a table showing the input-output relationship in the case where the magnetizing direction of the second conductive layer 14 of the spin transistor MT1 or the spin direction is "antiparallel" with respect to the magnetizing direction of the first conductive layer 12, and the magnetizing direction of the second conductive layer 14 of the spin transistor MT2 is "parallel" with respect to the magnetizing direction of the first conductive layer 12 in the programmable logic circuit illustrated in FIG. 25. Particularly, in this case, the spin transistor MT1 is in a high-impedance state. As can be seen from the table, the relationship between the output Y' and the inputs B and A conforms to the truth table of AND logic operations. This means that the programmable logic circuit illustrated in FIG. 25 functions as an AND circuit.

FIG. 26B is a table showing the input-output relationship in the case where the magnetizing direction of the second conductive layer 14 of each of the spin transistors MT1 and MT2, namely, the spin direction, is "parallel" with respect to the magnetizing direction of the first conductive layer 12 in the programmable logic circuit illustrated in FIG. 25. As can be seen from the table, the relationship between the output Y' and the inputs B and A conforms to the truth table of OR logic operations. This means that the programmable logic circuit illustrated in FIG. 25 functions as an OR circuit.

In view of the above facts, with the programmable logic circuit illustrated in FIG. 21 or 25, either an AND circuit or an OR circuit can be realized by controlling the magnetizing direction of the second conductive layer 14. As an AND circuit and an OR circuit are basic circuits, various logic circuits including a NAND circuit, a NOR circuit, and an EX-OR circuit, can be constructed by combining an AND circuit and an OR circuit.

In the above description of each programmable logic circuit according to the above described embodiment, the connection between the two spin transistors has been described in terms of the connection between the source and drain. However, since the first conductive layer 12 (namely, a magnetism fixing layer) and the second conductive layer 14 (namely, a magnetic recording layer) can function as a source and a drain, as described in the description of the first embodiment, two magnetism fixing layers may be connected to each other, or two magnetic recording layers may be connected to each other, or a magnetism fixing layer and a magnetic recording layer may be connected to each other between the two spin transistors. With such a simple connecting structure, a programmable logic circuit having excellent characteristics can be provided.

One of the spin transistors MT1 and MT2 shown in FIG. 21 or 25 may be replaced with a regular MOS transistor. For example, even if the spin transistor MT1 in FIG. 21 is replaced with a regular NMOS transistor having a floating gate, the same results as the truth table shown in FIGS. 24A and 24B can be obtained.

As described above, with a programmable logic circuit according to the seventh embodiment, a logic circuit that switches between an AND circuit and an OR circuit in accordance with the magnetizing direction of the second conductive layer 14 can be established. Especially, each of the spin transistors that constitute the programmable logic circuit has a switching function and a non-volatile memory function. Accordingly, the problem of the complicated wiring between devices in a conventional programmable logic circuit (that has a switching unit and a memory function unit formed by separate devices) can be eliminated.

Figure 27A:
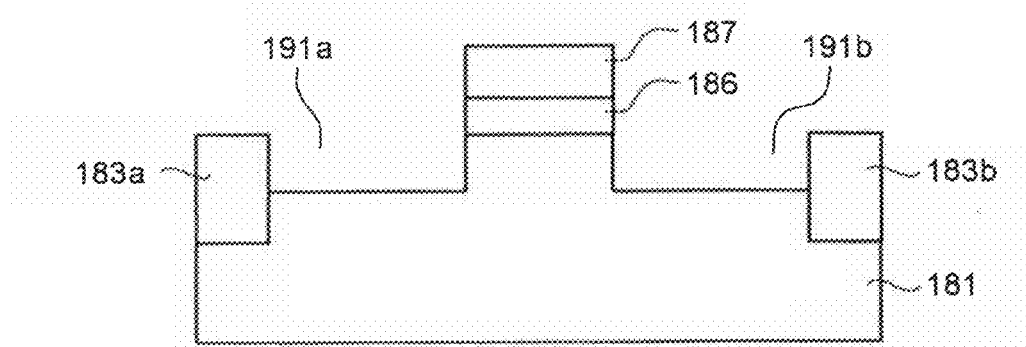
FIG. 27A is a cross-sectional view illustrating the procedure of forming a first conductive layer embedding region and a second conductive layer embedding region among the procedures for manufacturing a spin transistor according to an eighth embodiment of the present invention.
Figure 27B:
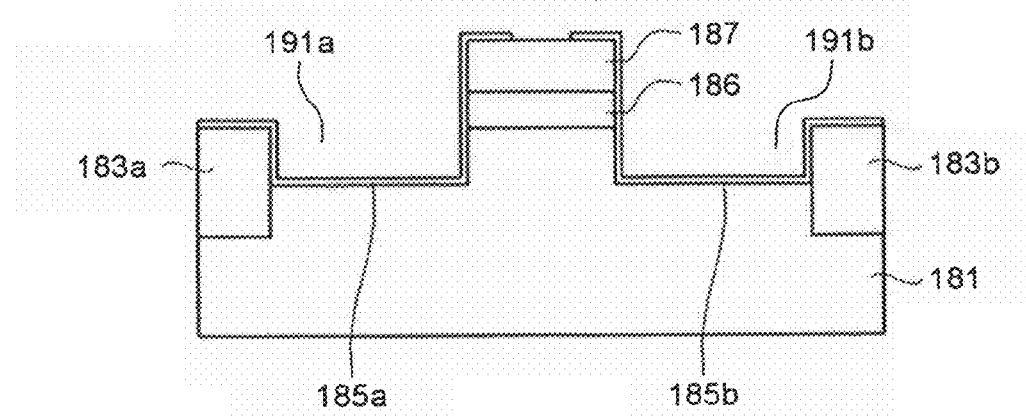
FIG. 27B is a cross-sectional view illustrating the procedure of forming tunnel barrier films among the procedures for manufacturing a spin transistor according to the eighth embodiment.
Figure 27C:
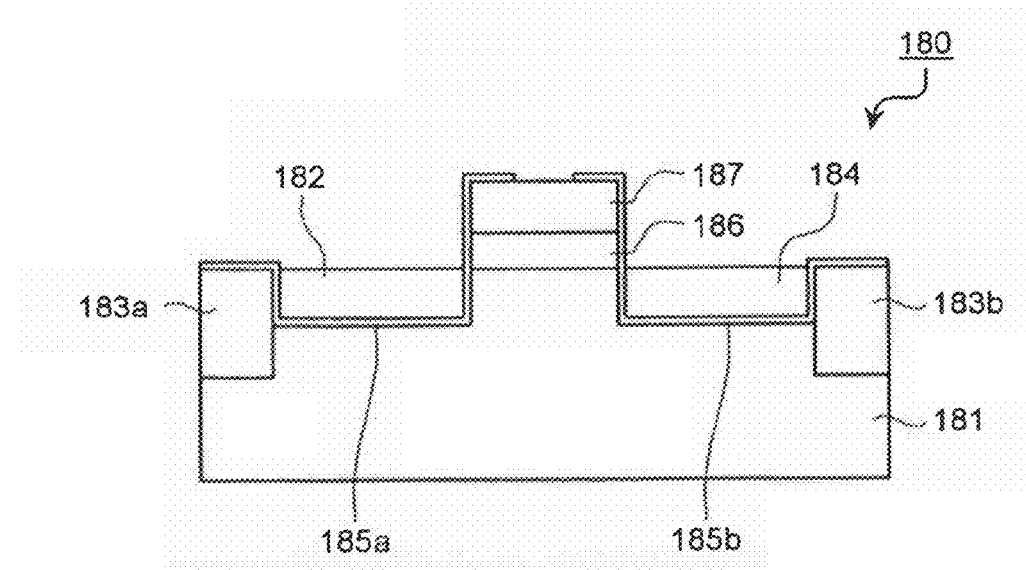
FIG. 27C is a cross-sectional view illustrating the procedure of forming a first conductive layer and a second conductive layer among the procedures for manufacturing a spin transistor according to the eighth embodiment.

In the following, the procedures for manufacturing a spin transistor (the same one as the spin transistor illustrated in FIG. 1) according to the first embodiment will be described as an eighth embodiment of the present invention. FIGS. 27A through 27C are cross-sectional views illustrating the procedures for manufacturing the spin transistor. First, field oxide films 183a and 183b for defining device regions are formed on a silicon substrate 181. A first conductive layer embedding region 191a, a second conductive layer embedding region 191b, a gate insulating film 186, and a gate electrode 187 are then formed by a known lithography technique, a known etching technique, and a known film forming technique (FIG. 27A). The gate insulating film 186 and the gate electrode 187 are made of the same materials as those employed in the first embodiment.

Tunnel barrier films 185a and 185b are formed on the exposed surfaces of the field oxide films 183a and 183b, the first conductive layer embedding region 191a, the second conductive layer embedding region 191b, the gate insulating film 186, and the gate electrode 187, by sputtering and plasma oxidization (FIG. 27B). Part of the surface of the gate electrode 187 is exposed, so that wiring and connection can be arranged on the exposed surface. The tunnel barrier films 185a and 185b are also made of the same material as that employed in the first embodiment. A first conductive layer 182 and a second conductive layer 184 are then formed on the first conductive layer embedding region 191a and the second conductive layer embedding region 191b, respectively, by sputtering (FIG. 27C). Here, the sputtering is performed with a sputtering device having strong directivity. The first conductive layer 182 and the second conductive layer 184 can be made of different materials from each other by employing different resist masks. In this manner, a spin transistor 180 that has the tunnel barrier films 185a and 185b formed between the first conductive layer 182 and a channel region of the silicon substrate 181, and between the second conductive layer 184 and a channel region of the silicon substrate 181, respectively, can be obtained.

As described above, by the manufacturing method according to the eighth embodiment, a spin transistor of the first embodiment can be readily manufactured using a known semiconductor manufacturing technique.

The spin injecting structure of any spin transistor according to the fourth through sixth embodiments is advantageous as a structure that provides the memory function of a magnetic memory such as a MRAM. In the following, a magnetic memory with the spin injecting structure of a spin transistor according to the sixth embodiment, which has the function of switching memory holding states and recording states by generating a reflux magnetic domain, will be described. FIG. 28 is a schematic cross-sectional view of the magnetic memory according to the ninth embodiment.

In the magnetic memory 200 illustrated in FIG. 28, an antiferromagnetic layer 285, a magnetism fixing layer 286, a tunnel barrier layer 287, a magnetic recording layer 214, a non-magnetic layer 261a, a non-magnetic layer 261b, a magnetism fixing layer 262a, a magnetism fixing layer 262b, an electrode 263a, and an electrode 263b are respectively equivalent, in terms of the material and the function, to the antiferromagnetic layer 16, the first conductive layer 12, the tunnel barrier film 11a (and 11b), the second conductive layer 14, the non-magnetic layer 161a, the non-magnetic layer 161b, the magnetism fixing layer 162a, the magnetism fixing layer 162b, the electrode 163a, and the electrode 163b, which are shown in FIG. 17A. Especially, the non-magnetic layer 261a and the magnetism fixing layer 262a are stacked in this order as the first multi-layer film on the surface of the magnetic recording layer 214, and the non-magnetic layer 261b and the magnetism fixing layer 262b are stacked in this order as a second multi-layer film on the surface of the magnetic recording layer 214, as in the structure shown in FIG. 17A. In the structure shown in FIG. 28, the equivalent part to the channel region of the structure shown in FIG. 17A is a lower magnetic recording layer 288 that is made of the same material as the magnetic recording layer 214. Since there is no need to form a channel in the magnetic memory 200, the lower magnetic recording layer 288 functions simply as the window for electron spin injection. However, this injection window needs to be located only immediately below the magnetic domain equivalent to the proximate magnetic domain described in the sixth embodiment among reflux magnetic domains formed in the magnetic recording layer 214. This is because the recording state of the magnetic memory depends on the magnetizing direction of the proximate magnetic domain in a generated reflux magnetic domain. The lower magnetic recording layer 288 may be omitted though.

The above described laminated structure is formed on a base electrode layer 296. More specifically, a conductive layer 284 is further formed on the surface of the base electrode layer 296. As shown in FIG. 28, the antiferromagnetic layer 285, the magnetism fixing layer 286, the tunnel barrier layer 287, and the lower magnetic recording layer 288 are laminated in this order on the conductive layer 284. The spin injecting structure that has the magnetic recording layer 214 as the principal component is formed on the lower magnetic recording layer 288. Also, an electrode extension layer 264a is formed on the electrode 263a, and a bit line 270 is formed on the electrode extension layer 264a. The memory function unit of the magnetic memory 200 is realized by the structure interposed between the bit line 270 and the base electrode layer 296.

Under the base electrode layer 296, a selective transistor that reads the recording state of the memory function unit is formed, and a source electrode extension layer 294 of the selective transistor is electrically connected to the base electrode layer 296. The selective transistor is formed with a semiconductor substrate 290, a source region 292 and a drain region 293 that are formed on the semiconductor substrate 290, and a gate electrode 291. Further, the source electrode extension layer 294 is formed on the source region 292, and a drain electrode extension layer 295 is formed on the drain region 293. The region between the bit line 270 and the semiconductor substrate 290 other than the above described laminated structure is filled with an insulating material.

In other words, the magnetic memory 200 has the above described memory function unit in place of the TMR device in the cell of a conventional MRAM. Accordingly, magnetic memories 200 are arranged in an array fashion, so as to construct a memory cell array.

Instead of the structure including the magnetic recording layer 214, the lower magnetic recording layer 288, the tunnel barrier layer 287, and the magnetism fixing layer 286, a TMR device that forms a MRAM may be employed. In such a structure, a reflux magnetic domain is generated within the TMR device. More specifically, an insulating layer (or a dielectric layer) is employed in place of the tunnel barrier layer 287. This insulating layer may be made of $Al_2O_3$, $SiO_2$, MgO, AlN, $Bi_2O_3$, $MgF_2$, $CaF_2$, $SrTiO_2$, $AlLaO_3$, or AlNo, for example. These compounds do not need to have precise compositions in terms of stoichiometry, and may have defects or excess and deficiency in oxygen, nitrogen, or fluorine. The thickness of this insulating film (or the dielectric layer) should preferably be so thin that the tunnel current can flow through the film, and, more specifically, should be 10 nm or smaller.

Figure 29A:
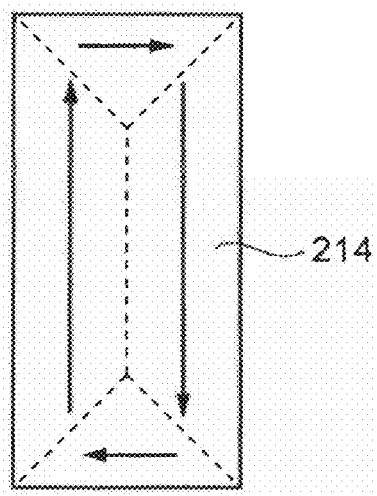
FIG. 29A illustrates a reflux magnetic domain that is formed on a magnetic recording layer.
Figure 29B:
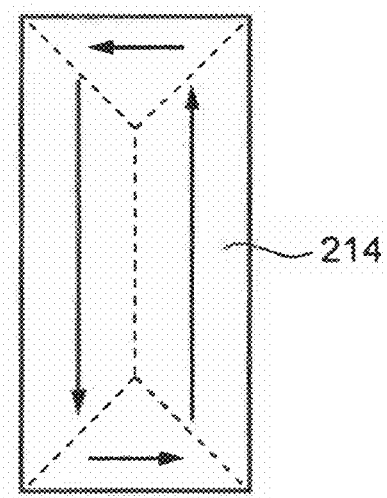
FIG. 29B illustrates another example of a reflux magnetic domain that is formed on a magnetic recording layer.

FIGS. 29A and 29B illustrate reflux magnetic domains to be formed on the magnetic recording layer 214. In the same manner as in the magnetism controlling operation through spin injection described in the sixth embodiment, the magnetizing direction of a reflux magnetic domain can be controlled through spin injection (indicated by the dotted line in FIG. 28) on the magnetic recording layer 214 of the magnetic memory 200. This spin injection is performed by applying current between the electrodes 263a and 263b. Also, as in a MRAM, the recording state of the magnetic memory 200 can be detected by the amount of current (indicated by the dashed line in FIG. 28) flowing between the bit line 270 and the drain electrode extension layer 295.

In FIG. 28, the width of the layer structure between the base electrode layer 296 and the magnetic recording layer 214, namely, the width of each of the conductive layer 284, the antiferromagnetic layer 285, the magnetism fixing layer 286, the tunnel barrier layer 287, and the lower magnetic recording layer 288, is smaller than the magnetic recording layer 214. However, the width of the layer structure between the base electrode layer 296 and the magnetic recording layer 214 may be the same as the width of the magnetic recording layer 214, as shown in FIG. 30. In a magnetic memory 300 shown in FIG. 30, a conductive layer 384, an antiferromagnetic layer 385, a magnetism fixing layer 386, and a tunnel barrier layer 387 are formed in this order on a base electrode layer 396. The width of each of those layers is the same as the width of the magnetic recording layer 214.

Figure 31:
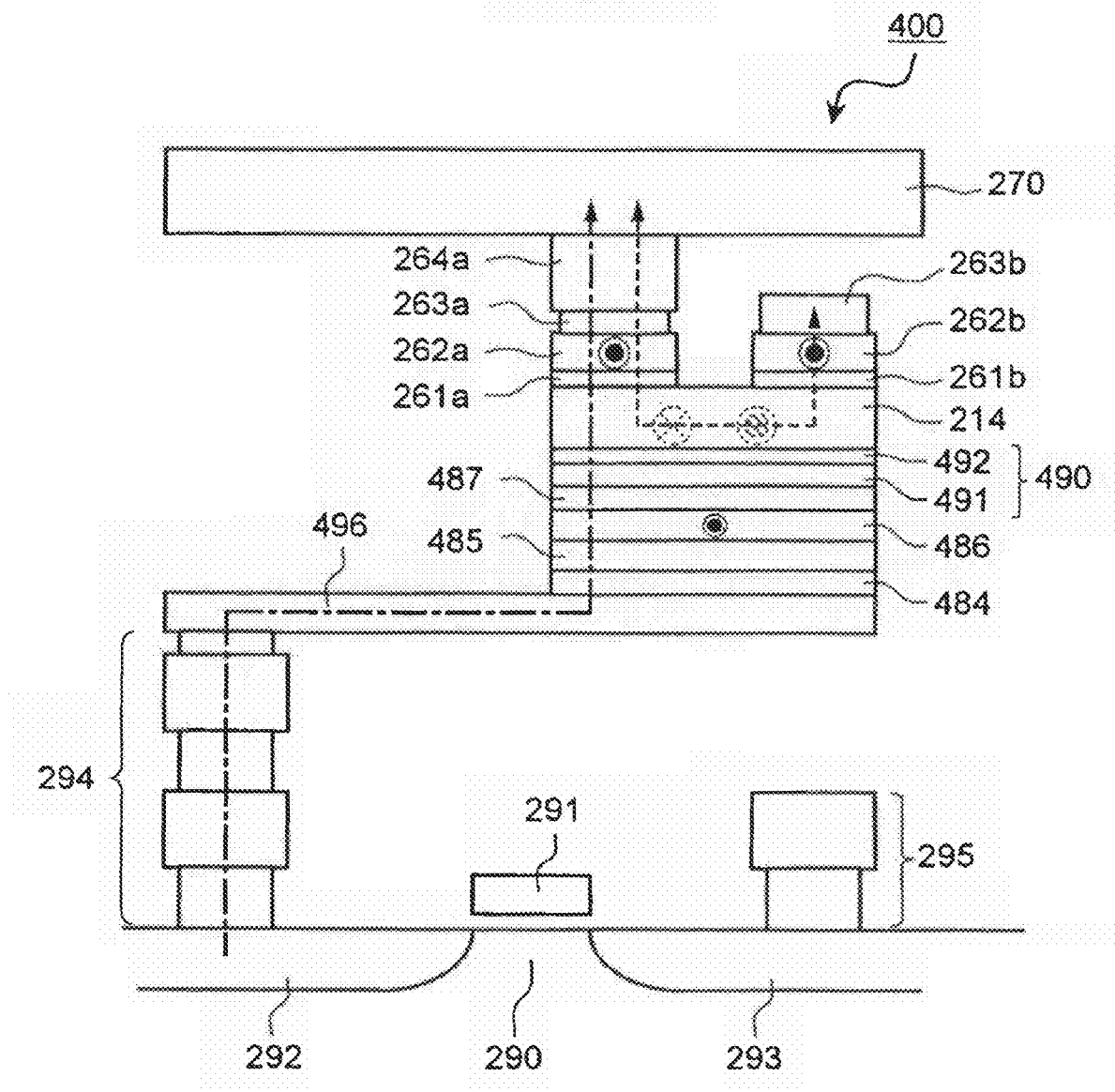
FIG. 31 illustrates a modification of the magnetic memory of FIG. 30.

Further, in the structure illustrated in FIG. 30, a spin reflection layer may be disposed between the magnetic recording layer 214 and the tunnel barrier layer 387. In a magnetic memory 400 shown in FIG. 31, a base electrode layer 496, a conductive layer 484, an antiferromagnetic layer 485, a magnetism fixing layer 486, and a tunnel barrier layer 487 are equivalent to the base electrode layer 396, the conductive layer 384, the antiferromagnetic layer 385, the magnetism fixing layer 386, and the tunnel barrier layer 387 shown in FIG. 30, respectively. In this magnetic memory 400, a spin reflection layer 490 is formed between the magnetic recording layer 214 and the tunnel barrier layer 487. The spin reflection layer 490 is a multi-layer film that has a magnetic layer 491 and a non-magnetic layer 492 laminated in this order.

As the spin reflection layer 490, one of the following combinations of materials may be employed. Accordingly, in the case where the magnetic recording layer (a free layer) 214 of a magnetoresistive device or a magnetic memory is made of a ferromagnetic material (a metal, an alloy, a compound, or the like) containing Co, it is preferable to use a metal, an alloy, or the like containing at least one element selected from the group consisting of Cr, Ru, Ir, Os, and Re, as the material for the non-magnetic layer 492 that is in contact with the magnetic recording layer 214. In the case where the magnetic recording layer 214 is made of a ferromagnetic material (a metal, an alloy, a compound, or the like) containing Fe, it is preferable to use a metal, an alloy, or the like containing at least one element selected from the group consisting of Cr, Ru, Os, Re, W, Mn, V, Ti, and Mo, as the material for the non-magnetic layer 492 that is in contact with the magnetic recording layer 214. In the case where the magnetic recording layer 214 is made of a ferromagnetic material (a metal, an alloy, a compound, or the like) containing Ni, it is preferable to use a metal, an alloy, or the like containing at least one element selected from the group consisting of Cr, Ru, Os, Re, Rh, Ir, W, Nb, V, Ta, and Mo, as the material for the non-magnetic layer 492 that is in contact with the magnetic recording layer 214. Here, if the material of the magnetic recording layer 214 is an alloy such as Ni—Co, Ni—Fe, Co—Fe, Co—Fe—Ni, it is preferable to use a common non-magnetic material among preferred non-magnetic materials for Co, Fe, and Ni. In each of the above described cases, the magnetic layer 491 may be made of the same material as the magnetic recording layer 214, but it is not limited to that. With this spin reflection layer 490, the spin injection current can be further reduced. Also, the current flowing through the current path that is formed with the magnetism fixing layer 262a, the non-magnetic layer 261a, the magnetic recording layer 214, the non-magnetic layer 261b, and the magnetism fixing layer 262b, can be increased at the time of spin injection. Further, the damage upon the tunnel barrier layer 487 can be reduced.

FIG. 32 illustrates another modification of the magnetic memory shown in FIG. 28. In a magnetic memory 500 shown in FIG. 32, a conductive layer 584, an antiferromagnetic layer 585, a magnetism fixing layer 586, a tunnel barrier layer 588, a magnetic recording layer 514, a non-magnetic layer 561a, a non-magnetic layer 561b, a magnetism fixing layer 562a, a magnetism fixing layer 562b, an electrode 563a, an electrode 563b, and an electrode extension layer 564a are equivalent to the conductive layer 284, the antiferromagnetic layer 285, the magnetism fixing layer 286, the tunnel barrier layer 287, the magnetic recording layer 214, the non-magnetic layer 261a, the non-magnetic layer 261b, the magnetism fixing layer 262a, the magnetism fixing layer 262b, the electrode 263a, the electrode 263b, and the electrode extension layer 264a shown in FIG. 28, respectively.

The structure illustrated in FIG. 32 differs from the structure illustrated in FIG. 28 in that an insulating layer 587 is formed between the tunnel barrier layer 588 and the magnetism fixing layer 586, and a few layers forming the memory function unit are tilted so that the bottom surface of the conductive layer 584 and part of the bottom surface of the tunnel barrier layer 588 are located on the same plane. More specifically, a tapered portion is formed in part of the conductive layer 584. The antiferromagnetic layer 585, the magnetism fixing layer 586, the insulating layer 587, the tunnel barrier layer 588, and the magnetic recording layer 514 are stacked on the conductive layer 584. Accordingly, each of these layers is also tapered. As shown in FIG. 32, the non-magnetic layer 561a and the magnetism fixing layer 562a are formed on the flat surface and the tapered surface of the magnetic recording layer 514. By forming a tunnel barrier at the edge portion in this manner, the joining area can be more effectively controlled with the film thickness of the antiferromagnetic layer 585 and the magnetism fixing layer 586, and variations in the joining area can be restricted. The spin reflection layer shown in FIG. 31 can be provided between the magnetic recording layer 514 and the tunnel barrier layer 588, so as to reduce the current at the time of spin injecting write.

Like a conventional MRAM, each of the magnetic memory structures shown in FIG. 28 and FIGS. 30 through 32 can be readily manufactured by a known semiconductor manufacturing method.

In FIG. 28 and FIGS. 30 through 32, each spin injection controlling structure maintains the "parallel" relationship between magnetic layers, as in the spin transistor illustrated in FIG. 17A. However, it is also possible to employ a spin injection controlling structure in which magnetic layers have the "antiparallel" relationship, as shown in FIG. 11A, FIG. 12, FIG. 13A, FIG. 14, FIG. 15A, and FIG. 16.

As described above, in a magnetic memory according to the ninth embodiment, the component corresponding to the TMR device of a MRAM is replaced with the spin injecting structure of a spin transistor of any of the fourth through sixth embodiments. Thus, a magnetic memory that has magnetic directions controlled through spin injection can be provided. Such a magnetic memory also achieves the same effects as the effects of the fourth through sixth embodiments.

It should be noted that the present invention is not limited to the above described specific examples, but other effects and modifications should be obvious to those skilled in the art. Accordingly, various changes and modifications can be made to the above described embodiments of the present invention, without deviating from the scope of the claims and the equivalents.

As described above, a spin transistor according to the present invention is effective as a switching device having an amplifying function and a memory function, and is especially suitable for the use as a unit device of a programmable logic circuit. Also, a magnetic memory according to the present invention is suitable for the use as a non-volatile memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin transistor, comprising:
a non-magnetic semiconductor substrate having a channel region, a first area, and a second area, the channel region being between the first area and the second area;
a first conductive layer located above the first area and made of a ferromagnetic material magnetized in a first direction;
a second conductive layer located above the second area and made of a ferromagnetic material magnetized in one of the first direction and a second direction that is antiparallel with respect to the first direction, the channel region introducing electron spin between the first conductive layer and the second conductive layer;
a gate electrode located between the first conductive layer and the second conductive layer and above the channel region; and
a tunnel barrier film located between the non-magnetic semiconductor substrate and at least one of the first conductive layer and the second conductive layer.

2. The spin transistor according to claim 1, wherein such voltage as to adjust the energy level of the channel region is applied to the gate electrode.

3. The spin transistor according to claim 1, further comprising an antiferromagnetic layer that is in contact with the first conductive layer.

4. The spin transistor according to claim 1, further comprising an insulating film that is located between the gate electrode and at least one of the first conductive layer and the second conductive layer.

5. The spin transistor according to claim 1, further comprising:
a first multi-layer film that is located on the second conductive layer; and
a second multi-layer film that is located on the second conductive layer and is located at a distance from the first multi-layer film,
wherein the first multi-layer film includes a first non-magnetic layer that is located on the second conductive layer, and a first magnetic layer that is located on the first non-magnetic layer and is magnetized in a third direction,
the second multi-layer film includes a second non-magnetic layer that is located on the second conductive layer, and a second magnetic layer that is located on the second non-magnetic layer and is magnetized in a fourth direction,
a magnetizing direction of the second conductive layer being controlled with the direction of current flowing between the first multi-layer film and the second multi-layer film via the second conductive layer.

6. The spin transistor according to claim 5, wherein
the third direction is the same as the first direction or the second direction, and
the third direction and the fourth direction are opposite to each other.

7. The spin transistor according to claim 6, wherein the first multi-layer film has a third non-magnetic layer that is located on the first magnetic layer, and a third magnetic layer that is located on the third non-magnetic layer and is magnetized in a fifth direction that is antiparallel with respect to the third direction.

* * * * *

UNITED STATES PATENT AND TRADEMARK OFFICE
CERTIFICATE OF CORRECTION

| | | |
|---|---|---|
| PATENT NO. | : 7,652,315 B2 | Page 1 of 1 |
| APPLICATION NO. | : 12/169423 | |
| DATED | : January 26, 2010 | |
| INVENTOR(S) | : Saito et al. | |

It is certified that error appears in the above-identified patent and that said Letters Patent is hereby corrected as shown below:

On the title page, Item (73), the Assignee's information is incorrect. Item (73) should read:

-- (73) Assignee:   Kabushiki Kaisha Toshiba, Tokyo (JP) --

Signed and Sealed this

Thirtieth Day of March, 2010

David J. Kappos
*Director of the United States Patent and Trademark Office*